(12) United States Patent
Dasgupta et al.

(10) Patent No.: US 10,804,386 B2
(45) Date of Patent: Oct. 13, 2020

(54) GATE STACK DESIGN FOR GAN E-MODE TRANSISTOR PERFORMANCE

(71) Applicant: INTEL CORPORATION, Santa Clara, CA (US)

(72) Inventors: Sansaptak Dasgupta, Hillsborough, OR (US); Han Wui Then, Portland, OR (US); Marko Radosavljevic, Portland, OR (US); Sanaz K. Gardner, Portland, OR (US); Seung Hoon Sung, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/306,292

(22) PCT Filed: Jul. 1, 2016

(86) PCT No.: PCT/US2016/040716
§ 371 (c)(1),
(2) Date: Nov. 30, 2018

(87) PCT Pub. No.: WO2018/004660
PCT Pub. Date: Jan. 4, 2018

(65) Prior Publication Data
US 2019/0221660 A1 Jul. 18, 2019

(51) Int. Cl.
*H01L 29/778* (2006.01)
*H01L 29/51* (2006.01)
(Continued)

(52) U.S. Cl.
CPC ...... *H01L 29/7787* (2013.01); *H01L 29/2003* (2013.01); *H01L 29/205* (2013.01);
(Continued)

(58) Field of Classification Search
None
See application file for complete search history.

(56) References Cited

U.S. PATENT DOCUMENTS

2008/0203430 A1   8/2008   Simin et al.
2009/0189188 A1*  7/2009   Matsushita ......... H01L 29/7785
                                                    257/192
(Continued)

FOREIGN PATENT DOCUMENTS

WO   2018004660 A1   1/2018

OTHER PUBLICATIONS

International Search Report and Written Opinion recieved for PCT Application No. PCT/US2016/040716, dated Apr. 26, 2017. 14 pages.
(Continued)

*Primary Examiner* — Ali Naraghi
(74) *Attorney, Agent, or Firm* — Finch & Maloney PLLC

(57) ABSTRACT

A gate stack structure is disclosed for inhibiting charge leakage in III-V transistor devices. The techniques are particularly well-suited for use in enhancement-mode MOSHEMTs, but can also be used in other transistor designs susceptible to charge spillover and unintended channel formation in the gate stack. In an example embodiment, the techniques are realized in a transistor having a III-N gate stack over a gallium nitride (GaN) channel layer. The gate stack is configured with a relatively thick barrier structure and wide bandgap III-N materials to prevent or otherwise reduce channel charge spillover resulting from tunneling or thermionic processes at high gate voltages. The barrier structure is configured to manage lattice mismatch conditions, so as to provide a robust high performance transistor design. In some cases, the gate stack is used in conjunction
(Continued)

with an access region polarization layer to induce two-dimensional electron gas (2DEG) in the channel layer.

20 Claims, 15 Drawing Sheets

(51) Int. Cl.
  *H01L 29/20* (2006.01)
  *H01L 29/205* (2006.01)
  *H01L 29/66* (2006.01)
  *H01L 29/49* (2006.01)
  *H01L 29/43* (2006.01)
  *H01L 29/08* (2006.01)
  *H01L 29/06* (2006.01)
  *H01L 29/423* (2006.01)

(52) U.S. Cl.
  CPC ......... *H01L 29/513* (2013.01); *H01L 29/517* (2013.01); *H01L 29/66462* (2013.01); *H01L 29/7786* (2013.01); *H01L 29/0649* (2013.01); *H01L 29/0847* (2013.01); *H01L 29/4236* (2013.01); *H01L 29/432* (2013.01); *H01L 29/4966* (2013.01)

(56) References Cited

U.S. PATENT DOCUMENTS

| | | |
|---|---|---|
| 2012/0217506 A1 | 8/2012 | Briere |
| 2014/0266324 A1 | 9/2014 | Teo et al. |
| 2015/0187924 A1* | 7/2015 | Dasgupta ............ H01L 29/7786 257/76 |
| 2015/0311331 A1* | 10/2015 | Yamada ............ H01L 29/66462 257/76 |
| 2016/0163792 A1* | 6/2016 | Oka .................. H01L 21/02356 257/636 |

OTHER PUBLICATIONS

International Preliminary Report on Patentability recieved for PCT Application No. PCT/US2016/040716, dated Jan. 10, 2019. 11 pages.

Liao, et al., "Reduced Interface States of Atomic-Layer-Deposited Al2O3/AlGaN/GaN Heterostructure Containing in Situ Grown AlN/GaN Cap Layer and Subjected to Thermal Oxidation." Journal of the Electrochemical Society. Jun. 2015, vol. 162, issue 9, pp. 160-165.

* cited by examiner

Charge Distribution:
(A) VG-VT<1.5 volts
(B) VG-VT>1.5 volts

CPRL: Charge Spillover Reducing Layer
LGL: Lattice Grading Layer
MEL: Mobility Enhancement Layer CPRL: Charge Spillover Reducing Layer
LGL: Lattice Grading Layer
MEL: Mobility Enhancement Layer
ARPL: Access Region Polarization Layer WFTS: Work Function Tuning Structure
HKGDS: High-k Gate Dielectric Structure

GATE STACK DESIGN FOR GAN E-MODE TRANSISTOR PERFORMANCE

BACKGROUND

A metal oxide semiconductor high-electron-mobility transistor (MOSHEMT) is a field-effect transistor that includes a heterojunction between two materials having different band gaps as the channel. A gallium nitride transistor is an example of such a transistor. An enhancement-mode (e-mode) MOSHEMT can be turned off by setting the gate-to-source voltage to 0 volts, and can be turned on by making the gate voltage higher than the source voltage (for n-type metal oxide semiconductor, NMOS) or lower than the source voltage (for p-type metal oxide semiconductor, PMOS). There are a number of performance issues that can arise with such transistors.

Figure 1A:
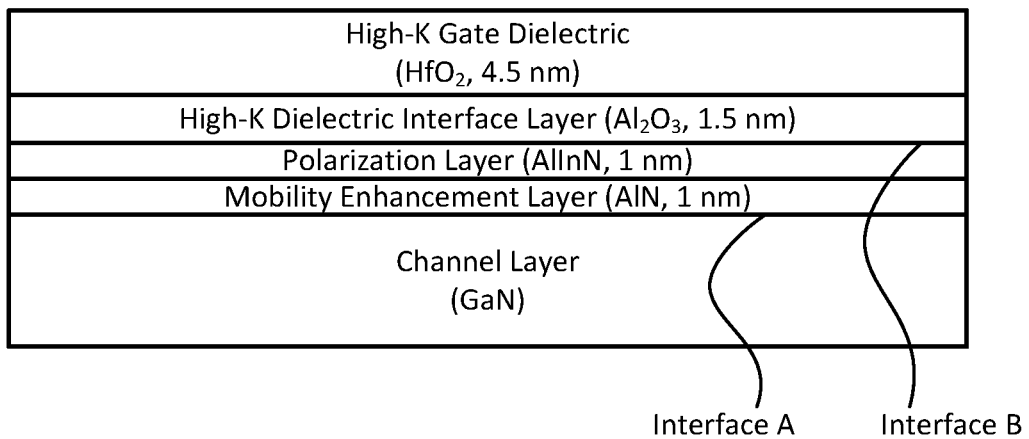
FIG. 1a illustrates an example gate stack configuration susceptible to charge leakage from the gallium nitride (GaN) channel into the gate oxide interface.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

A gate stack structure is disclosed for inhibiting charge leakage in III-V transistor devices. The techniques are particularly well-suited for use in enhancement-mode MOSHEMTs, but can also be used in other transistor designs susceptible to charge spillover and unintended channel formation in the gate stack, as will be appreciated in light of this disclosure. In an example embodiment, the techniques are realized in a transistor having a III-N gate stack over a gallium nitride (GaN) channel layer. The gate stack is configured with a thick lattice matched barrier structure and relatively wide bandgap III-N materials to prevent or otherwise reduce channel charge leakage (spillover) at high gate voltages. In some embodiments, the gate stack is used in conjunction with an access region polarization layer to induce two-dimensional electron gas (2DEG) in the channel layer.

General Overview

Figure 1B:
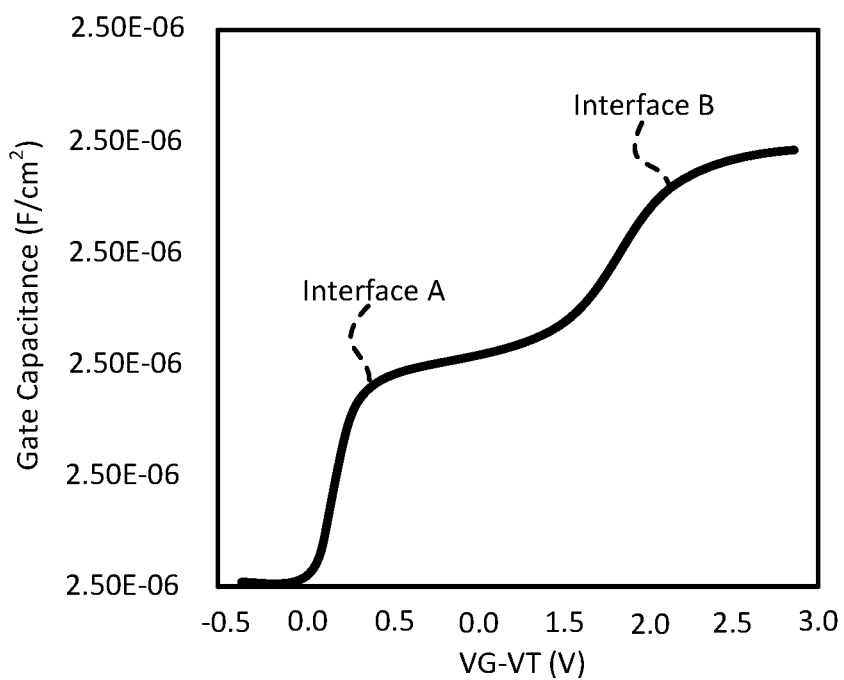
FIG. 1b illustrates a capacitance-voltage (C-V) measurement of the gate stack shown in FIG. 1a and reveals both a second unintended channel resulting from channel charge leakage.

As previously noted, there are a number of performance issues that can arise with transistors such as GaN enhancement-mode MOSHEMTs. One such problem has to do with charge leakage from the GaN channel into the gate oxide interface at high gate voltages (e.g., >1.5 volts). This charge leakage reduces the maximum current that the transistor can provide, and results in transconductance (also referred to as gm) compression and reduced performance. An example gate stack of a GaN transistor susceptible to such leakage is shown in FIG. 1a. As can be seen, the gate stack includes a mobility enhancement layer of aluminum nitride (AlN) on a channel layer of GaN. A polarization layer of aluminum indium nitride (AlInN) is provided on the mobility enhancement layer. A high-k dielectric structure is provided on the polarization layer, the structure including an interface layer of aluminum oxide ($Al_2O_3$) and a gate dielectric layer of hafnium oxide ($HfO_2$). The mobility enhancement layer is about 1 nm and partially induces two-dimensional electron gas (2DEG) in the GaN channel layer, but primarily reduces alloy induced scattering in the GaN channel layer. In more detail, if the AlInN polarization layer was directly on the GaN channel layer, mobility in the GaN channel layer would be reduced, due to the fact that AlInN is an alloy of two group III elements (Al and In). The AlInN polarization layer is also about 1 nm and is primarily responsible for inducing 2DEG in the GaN channel layer. The $Al_2O_3$ interface layer is about 1.5 nm and is used to provide better electrical interface between the $HfO_2$ gate dielectric and the underlying AlInN polarization layer and thus provides better transistor performance. The $HfO_2$ high-k gate dielectric is about 4.5 nm and has high dielectric constant (relative to silicon dioxide) and thus higher capacitance despite large thickness (which inhibits leakage). As can be further seen from the charge distribution depicted in FIG. 1a, the channel charge of the transistor (gate voltage $V_G$ minus transistor threshold voltage $V_T$), which should ideally remain at the GaN/AlN interface (designated interface A), leaks or otherwise spills over for higher gate voltage conditions to the AlInN/$Al_2O_3$ interface (designated interface B) thereby forming a second, unintended channel. The capacitance-voltage (C-V) measurement shown in FIG. 1b further reveals that for higher gate voltages, an additional hump appears in the C-V curve thereby indicating the presence of the second unintended channel close to the $Al_2O_3$/AlInN (interface B), in addition to the desired channel close to the GaN/AlN interface (interface A). This charge spillover and resulting unintended channel formation causes significant channel charge reduction at interface A and leads to transconductance compression in the transistor. The saturation drain current is also thus compromised.

Thus, the present disclosure provides a gate stack structure for inhibiting charge leakage in III-V transistor devices. In an example embodiment, the techniques are realized in a transistor having a III-N gate stack over a GaN channel layer. The gate stack is configured with a relatively thick barrier structure and wide bandgap III-N materials to prevent or otherwise reduce channel charge spillover resulting from tunneling or thermionic processes at high gate voltages. The barrier structure is configured to manage lattice mismatch conditions, so as to provide a robust high performance transistor design. In some embodiments, the gate stack is used in conjunction with an access region polarization layer to induce two-dimensional electron gas (2DEG) in the channel layer.

As noted, the gate stack configuration resolves both the issues of channel leakage (sometimes referred to herein as spillover) and lattice mismatch, which is not a trivial endeavor. For example, and with further reference to the example comparative gate stack shown in FIG. 1a, one possible approach to solve the spillover issue would be to thicken the AlN mobility enhancement layer from 1 nm to say 2 nm or 3 nm. In such cases, the charge spillover can be reduced, by virtue of the thicker AlN mobility enhancement layer having a large bandgap and a large delta conduction band ($\Delta E_c$) relative to the GaN channel layer. However, it is extremely challenging to grow thick AlN (>1 nm) without relaxing the strain in the AlN mobility enhancement layer and in turn causing new defects and surface roughness. These defects and surface roughness can reduce the channel mobility and hence this approach is inadequate. A second possible approach to solve the spillover issue would be to increase the thickness of the AlInN polarization layer. However, doing so causes an extra amount of charge to accumulate in the GaN channel, thus rendering the transistor a depletion mode or "always on" device. Unfortunately, high voltage applications, such as voltage regulators and radio frequency (RF) power amplifiers, necessitate use of an enhancement mode transistor design or one that is off at a gate voltage $V_G$ of 0 volts.

In contrast to such comparative approaches, a gate stack configured in accordance with an embodiment of the present disclosure includes a barrier structure that includes a lattice grading layer and a charge spillover reducing layer. This barrier structure is provided over the channel layer in conjunction with other layers, such as a mobility enhancement layer, a polarization layer, and a high-k dielectric structure, to provide a high performance III-N transistor, according to some embodiments. The various layers of the gate stack are arranged to facilitate low leakage and hence vastly better channel properties, as well as reduced gm compression and improved power efficiency, relative to the other possible solutions previously noted with reference to FIG. 1a. In particular, the lattice grading layer is sandwiched between the mobility enhancement layer and the charge spillover reducing layer to provide the barrier structure. In addition, a distinct portion of the polarization layer is provided in the access regions of the transistor to create the 2DEG in those access regions. Note that the access regions generally refer to the region between the gate and the source, and the region between the gate and the drain.

The lattice grading layer serves a number of purposes. One such purpose is that it inserts a lattice grading step between the mobility enhancement layer and the charge spillover reducing layer, so that the charge spillover reducing layer does not relax or otherwise create new defects. In addition, the lattice grading layer is configured so as to not add additional channel charge. For instance, in one example embodiment, the lattice grading layer is a layer of aluminum gallium nitride (AlGaN) having an aluminium concentration in the range of about 5% to 15%, and a thickness from about 1 nm to 3 nm (e.g., ~2 nm). Note that the thickness refers to the distance between the mobility enhancement layer and the charge spillover reducing layer. Further note that relatively low aluminium content prevents or otherwise reduces additional channel charge.

The charge spillover reducing layer is on top of the lattice grading layer, and in some embodiments is a layer of AlN having thickness of about 1 nm. In some such cases, the gate stack further includes an AlN mobility enhancement layer of AlN also having a thickness of about 1 nm. So, in one specific such example embodiment, the gate stack includes an AlN mobility enhancement layer (~1 nm thick) on the channel layer, an AlGaN lattice grading layer (~2 nm thick) on the AlN mobility enhancement layer, and an AlN charge spillover reducing layer (~1 nm thick) on the AlGaN lattice grading layer. As will be appreciated, this three layer configuration collectively provides a thick barrier structure that is sufficiently lattice matched so as to simultaneously avoid defects and provide charge confinement at higher gate voltages $V_G$, according to an embodiment.

As previously noted, the polarization layer is at least partly provided in the access regions between the source and gate and the drain and gate, and thus helps in creating the 2DEG in the access regions. In one example embodiment, the access region polarization layer is a layer of AlInN having a thickness in the range of about 5 nm to 25 nm (e.g., ~8 nm). In one such case, the aluminum concentration is in the range of, for example, 80% to 85% (e.g., ~82%). In another example embodiment, the access region polarization layer is a layer of AlGaN having a thickness in the range of about 5 nm to 25 nm (e.g., ~8 nm). In one such case, the aluminum concentration is in the range of, for example, 20% to 40% (e.g., ~30%). In either case, note that the aluminum concentration in the access region polarization layer is higher than the aluminum concentration in the lattice grading layer. As will be appreciated in light of this disclosure, the access regions, having lengths $L_{SG}$ (for length between source and gate) and $L_{GD}$ (for length between gate and drain), can be configured to sustain breakdown voltage without compromising the on-resistance of the device. Further note that these distances $L_{SG}$ and $L_{GD}$ need not be symmetrical. For instance, $L_{SG}$ may be shorter than $L_{GD}$, or vice-versa. Numerous configurations will be apparent.

The gate dielectric structure can also vary from one embodiment to the next. In some cases, the structure includes a multilayer configuration having a layer of desired gate dielectric material and a layer of interface material to provide better electrical interface between the layer of desired gate dielectric material and the underlying charge spillover reducing layer. For instance, in one specific example case, the gate dielectric structure includes a layer of $Al_2O_3$ having a thickness of about 1 nm to 3 nm (e.g., 1.5 nm) and a gate dielectric layer of $HfO_2$ having a thickness of about 2 nm to 8 nm (e.g., 4.5 nm). In one such case, the $Al_2O_3$ is used to provide better electric interface between to an underlying AlN charge spillover reducing layer and the $HfO_2$ gate dielectric layer. Any number of gate dielectric structures can be used, as will be appreciated.

This gate stack can be grown on any number of different substrates on which GaN and other III-V transistors can be made, such as silicon carbide (SiC), sapphire, and silicon substrates, whether in the form of bulk substrates (e.g., 300 mm silicon substrate) or multilayer substrates (e.g., semiconductor-on-insulator substrates). As will be further appreciated in light of this disclosure, the gate stack can be formed using any number of techniques. In some embodiments, the gate stack is formed by a process including deposition of blanket films on a substrate using buffer engineering techniques followed by various patterning and further deposition processes. In other embodiments, the gate stack is formed by a process including III-N material growth in islands or trenches formed on a substrate using so-called lateral epitaxial overgrowth techniques. Numerous suitable substrates and forming processes can be used, as will be appreciated.

As used herein, group III-N semiconductor material (or III-N material or simply III-N) includes a compound of one or more group III elements (e.g., aluminum, gallium, indium, boron, thallium), with nitrogen. Accordingly, III-N material as used herein includes, but is not limited to, gallium nitride (GaN), indium nitride (InN), aluminum nitride (AlN), aluminum indium nitride (AlInN), aluminum gallium nitride (AlGaN), indium gallium nitride (InGaN), and aluminum indium gallium nitride (AlInGaN), to name a few examples of III-N materials. In a more inclusive manner, note that a group III-V material, as used herein, includes at least one group III element (e.g., aluminum, gallium, indium, boron, thallium) and at least one group V element (e.g., nitrogen, phosphorus, arsenic, antimony, bismuth), such as gallium nitride (GaN), gallium arsenide (GaAs), indium gallium nitride (InGaN), and indium gallium arsenide (InGaAs), to name some examples. Numerous group III-V material systems can be used in various embodiments of the present disclosure.

Use of the techniques and structures provided herein may be detectable in cross-sections of an integrated circuit using tools such as scanning electron microscopy (SEM) or transmission electron microscopy (TEM) that can show the various layers and structure of the device. Other methods, such as composition mapping, x-ray crystallography or diffraction (XRD), secondary ion mass spectrometry (SIMS), time-of-flight SIMS (ToF-SIMS), atom probe imaging, local electrode atom probe (LEAP) techniques, 3D tomography, high resolution physical or chemical analysis, to name some suitable example analytical tools. In some embodiments, for instance, a SEM may indicate a combination of a lattice matched multilayer barrier structure (e.g., an AlGaN layer sandwiched between two AlN layers) and an access region polarization layer. Numerous configurations and variations will be apparent in light of this disclosure.

Architecture

Figure 2A:
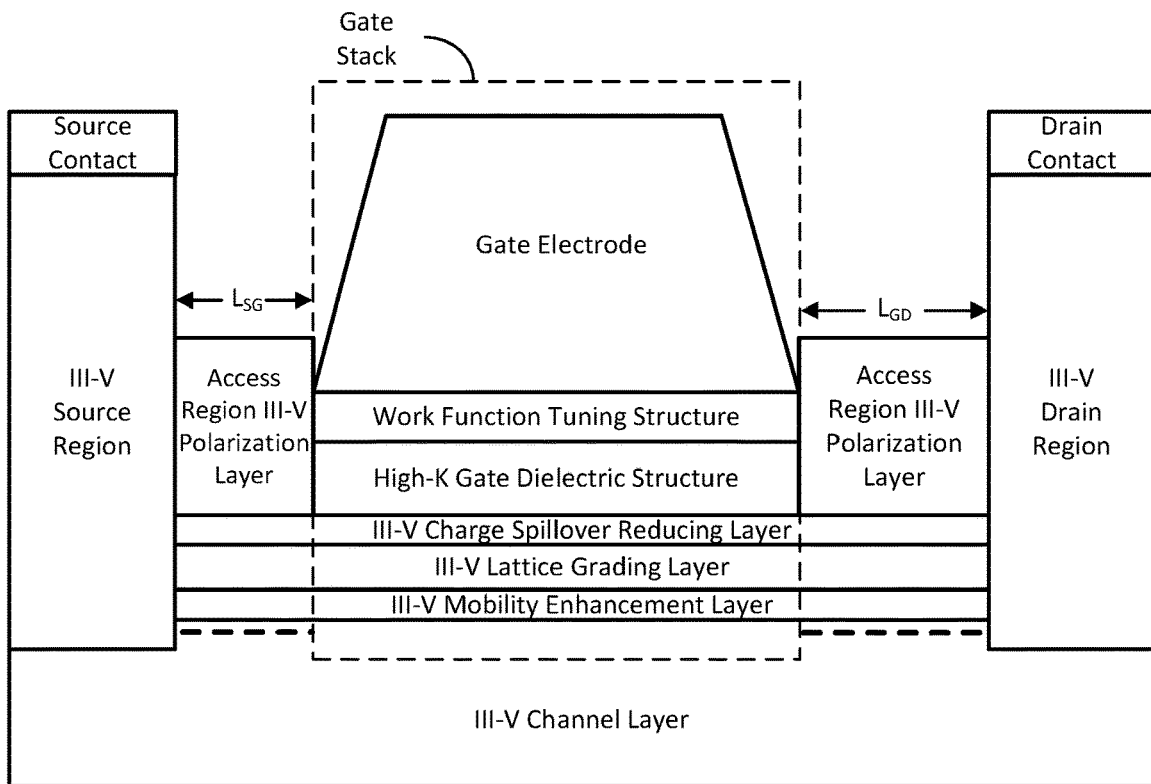
FIG. 2a is a cross-sectional view of an integrated circuit structure having a gate stack configured in accordance with an embodiment of the present disclosure.

FIG. 2a is a cross-sectional view of an integrated circuit structure having a gate stack configured in accordance with an embodiment of the present disclosure. As can be seen, the integrated circuit structure includes a III-V transistor having a channel layer, a gate stack generally delineated by a dashed box, and source/drain regions separated from the gate stack by access regions. The transistor can be any type of NMOS or PMOS transistor, but in one example embodiment is an NMOS enhancement-mode MOSHEMT. In a more general sense, the transistor can be any enhancement mode metal oxide semiconductor field effect transistor (MOSFET) transistor that uses a heterojunction between two group III-V semiconducting materials to confine electrons to a channel. In any such enhancement mode transistors, a voltage drop across the gate dielectric induces a conducting channel or 2DEG between the source and drain regions. Enhancement mode refers to an increase of conductivity with an increase in gate dielectric field which in turn adds carriers to the channel. The carriers can be electrons (for NMOS devices) or holes (for PMOS devices).

The gate stack is formed on the III-V channel layer and includes a III-V mobility enhancement layer, a III-V lattice grading layer on the mobility enhancement layer, a III-V charge spillover reducing layer on the lattice grading layer, a high-k dielectric structure on the charge spillover reducing layer, a work function tuning structure on the high-k dielectric structure, and a gate electrode on the work function tuning structure. As will be appreciated in light of this disclosure, the combination of the mobility enhancement layer, lattice grading layer, and the charge spillover reducing layer effectively form a lattice matched barrier structure configured to inhibit spillover (channel leakage to the gate dielectric interface) at high gate voltages. The previous discussion with respect to composition and thickness of these layers is equally applicable here.

The III-V polarization layer is provided in the access regions of the transistor to create the 2DEG in those access regions, as generally depicted with horizontal dashed lines in the channel layer. In this example case, note the distances $L_{SG}$ and $L_{GD}$ are asymmetric, in that $L_{GD}$ is larger than $L_{SG}$. In other embodiments, $L_{SG}$ is larger than $L_{GD}$, while in other embodiments, $L_{GD}$ is equal to $L_{SG}$. In a more general sense, $L_{SG}$ and $L_{GD}$ and may be symmetric or asymmetric and in the range of, for example, 20 nm to 150 nm. The previous discussion with respect to composition and thickness of this polarization layer deployed in the access region part of the transistor structure is equally applicable here.

As previously explained, the gate dielectric structure can vary from one embodiment to the next, but in some cases includes a multilayer configuration having a layer of desired gate dielectric material and a layer of interface material as previously explained. The interface material layer provides a better electric interface between to the charge spillover reducing layer and the desired material of the gate dielectric layer and can thus be adjusted to suit a given desired dielectric material and the underlying III-V material. The desired dielectric material can have any suitable dielectric constant, but in some embodiments is a high-k dielectric material, such as that suitable for a high-k gate dielectric of a group III-V transistor configuration. In general, a high-k dielectric material includes material having a dielectric constant greater than that of silicon dioxide (a k-value greater than 3.9). Example high-k dielectric materials include, for instance, hafnium oxide, hafnium silicon oxide, lanthanum oxide, lanthanum aluminum oxide, zirconium oxide, zirconium silicon oxide, tantalum oxide, tantalum silicon oxide, titanium oxide, barium strontium titanium oxide, barium titanium oxide, strontium titanium oxide, yttrium oxide, aluminum oxide, silicon oxide, lead scandium tantalum oxide, and lead zinc niobate, to name some examples. In some embodiments, an annealing process may be carried out on the desired dielectric material layer to improve its quality. The thickness of the interface material layer and desired dielectric material layers can vary from one embodiment to the next, but in some cases are in the range of 1 nm to 5 nm (e.g., 2 nm to 4 nm) and 1 nm to 25 nm (e.g., 4 nm to 20 nm). Further note that the gate dielectric structure may extend over the access region polarization layers toward the source/drain regions (on both sides, or just the source side, or just the drain side).

The work function tuning structure can also vary from one embodiment to the next, and is generally configured to provide a better interface between the gate electrode and the layer of desired gate dielectric material, thereby reducing contact resistance and further helps in depleting the channel. Other embodiments may not include work function tuning structure. The work function tuning structure may include, for example, one or more metal layers. Doping can be used to further increase conductivity of any such layer. The one or more layers may include, for example, aluminum, nickel, platinum, tantalum, titanium, titanium aluminum, tantalum nitride, titanium nitride, titanium aluminum, and aluminum nitride layers, or any combination of say materials in a multi-stack configuration, to name a few examples. In some embodiments, the overall thickness of the work function tuning structure is in the range of 10 nm to 25 nm (e.g., 1 nm to 5 nm layer of titanium nitride, and a 10 nm to 20 nm layer of nickel on top of the titanium nitride layer).

Note that the composition of the work function tuning structure may depend, in part, on the gate electrode material. The gate electrode may be any suitable metal, such as tungsten, gold, aluminum, titanium, titanium nitride, copper, and alloys thereof, to name a few examples. The thickness of the gate electrode can be, for example, in the range of 50 nm to 250 nm. Further note that the source and drain contacts can be made with similar materials, and dimensioned accordingly. In other embodiments, there are no source/drain contacts, such as cases where interconnection to the transistor is made by connecting directly to the surface of the source/drain regions.

The III-V source and drain regions can be implemented with any suitable III-V materials, as will be appreciated, and may be n-type doped or p-type doped. Example source/drain materials include, for instance, GaN, InN, AlN, AlInN, AlGaN, InGaN, and AlInGaN, GaAs, InGaN, and InGaAs, to name a few examples. Example dopants include, for instance, silicon, germanium (SiGe), silicon germanium, and boron. Concentration level of dopants and specific composition of source/drain materials can be on factors such as desired conductivity, composition of the channel layer, composition of the gate stack and access region polarization layers, and the growth process used. Likewise, the dimensions of the source/drain regions can be configured as desired for a given application and/or set of processes by which the overall structure is formed. The present disclosure is not intended to be limited to any particular source/drain configurations.

Figure 2B:
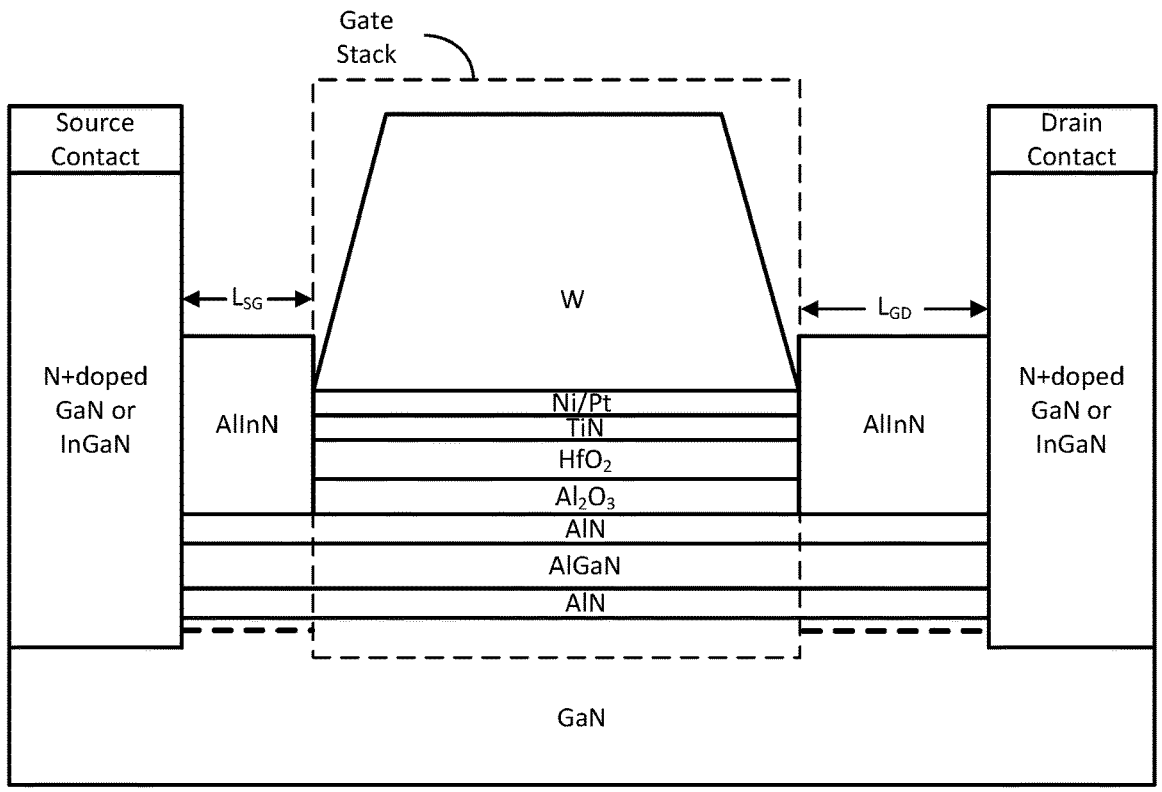
FIG. 2b is a cross-sectional view of an integrated circuit structure having a gate stack configured in accordance with another embodiment of the present disclosure.

FIG. 2b is a cross-sectional view of an integrated circuit structure having a gate stack configured in accordance with another embodiment of the present disclosure. Although specific materials are shown to provide various example configurations and embodiments, such specificity is not intended to limit the present disclosure to the particular example materials shown. Numerous other embodiments and configurations and variations will be apparent in light of this disclosure. As can be seen in the example case of FIG. 2b, the integrated circuit structure includes a III-N transistor having a channel layer of GaN, a gate stack generally delineated by a dashed box, and n-type doped III-N source/drain regions (e.g., N+doped GaN or InGaN) separated from the gate stack by access regions of AlInN. The transistor is an NMOS enhancement-mode MOSHEMT.

The gate stack is formed on the GaN channel layer and includes: a mobility enhancement layer of AlN having a thickness in the range of 0.5 nm to 2 nm (e.g., 1 nm); a lattice grading layer of AlGaN on the mobility enhancement layer and having a thickness in the range of 1 nm to 5 nm (e.g., 2 nm) and an aluminum concentration less than about 15% (e.g., 5% to 10%); a charge spillover reducing layer of AlN on the lattice grading layer and having a thickness in the range of 0.5 nm to 2 nm (e.g., 1 nm); a high-k dielectric bi-layer structure including a first layer of $Al_2O_3$ on the charge spillover reducing layer and having a thickness in the range 1 nm to 4 nm (e.g., 2 nm), and a second layer of $HfO_2$ on the $Al_2O_3$ layer and having a thickness in the range 4 nm to 20 nm (e.g., 10 nm to 15 nm); a bi-layer work function tuning structure including a first layer of titanium nitride (TiN) on the $HfO_2$ layer and having a thickness in the range 0.5 nm to 5 nm (e.g., 3 nm), and a second layer of nickel or platinum on the TiN layer and having a thickness in the range 10 nm to 20 nm (e.g., 10 nm to 15 nm); and a gate electrode of tungsten (W) on the nickel/platinum layer. Numerous other gate stack configurations will be apparent.

The AlInN polarization layer is provided in the access regions of the transistor to create the 2DEG in those access regions, has an aluminum concentration in the range of 80% to 85% (e.g., 82% to 83%). The access polarization layer of this example embodiment has a thickness in the range of 5 nm to 25 nm (e.g., 8 nm, referring to the vertical thickness, as depicted in the figures). Alternatively, the access polarization layer could be AlGaN that is similarly dimensioned, but has an aluminum concentration in the range of 20% to 40% (e.g., 30%). In either case, note that aluminum concentration is greater than the aluminum concentration of the AlGaN lattice matching layer having an aluminum concentration of less than 15%, according to this particular example embodiment. Further note that, in this example embodiment, the access polarization layer is on the AlN charge spillover reducing layer. However, in other example embodiments, the access polarization layer may be on the AlGaN lattice grading layer or the AlN mobility enhancement layer.

The source/drain regions of this example comprise n-type doped GaN or InGaN. In one such embodiment, the source/drain regions are n-doped with silicon or germanium or SiGe at a dopant concentration in the range of $1\times10^{18}$ to $1\times10^{21}$ atoms/$cm^3$ (e.g., $5\times10^{19}$ to $3\times10^{20}$ atoms/$cm^3$). In one specific example case, $L_{SG}$ is about 40 nm and $L_{GD}$ is about 90 nm. However, note that the source/drain regions can vary in dimension and distance from gate as previously explained, and further note that not embodiments have contact structures on the source/drain regions. Further note that although the transistor structure is shown having the source/drain contacts at the same level as the gate electrode, in other embodiments they need not be at the same height. In any such cases, a filler insulation material can be deposited to fill the open spaces of the structure (such as spaces above the access regions between the gate electrode and the source/drain regions), and then planarized to facilitate subsequent processing, such as interconnect formation.

Figure 2C:
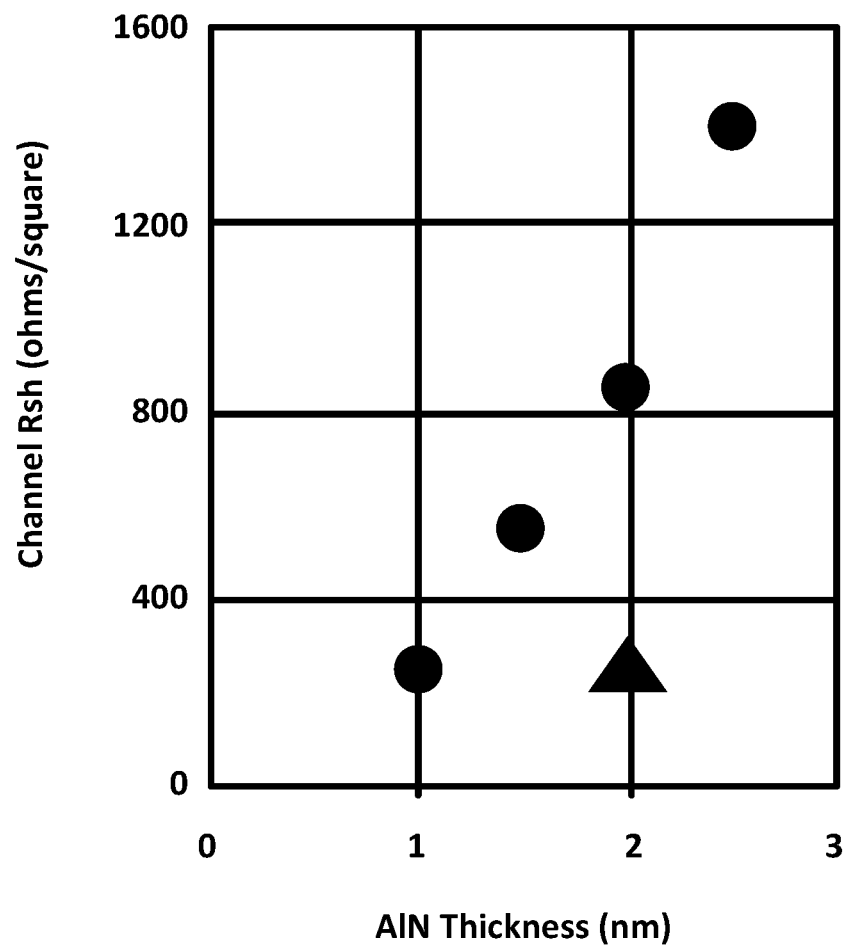
FIG. 2c graphically depicts channel resistance of the gate stack shown in FIG. 1a relative to increasing thickness of the mobility enhancement layer, and further graphically depicts channel resistance of a gate stack configured in accordance with an embodiment of the present disclosure.

FIG. 2c graphically depicts channel resistance of the gate stack shown in FIG. 1a relative to increasing thickness of the mobility enhancement layer, and further graphically depicts channel resistance of a gate stack configured in accordance with an embodiment of the present disclosure. Note how increasing the thickness of the AlN mobility enhancement layer alone degrades transistor performance by increasing channel resistance (as shown by the plotted circles). In contrast, a gate stack configured in according with an embodiment of the present disclosure provides an effective thickness of 2 nm for the AlN mobility enhancement layer (by having two AlN layers in the gate stack) and a channel resistance comparable to a AlN mobility enhancement layer having a thickness of 1 nm.

Blanket Deposition Forming Methodology

FIGS. 3a through 3f collectively illustrate an example process for preparing an integrated circuit structure having a gate stack configured in accordance with an embodiment of the present disclosure.

Figure 3A:
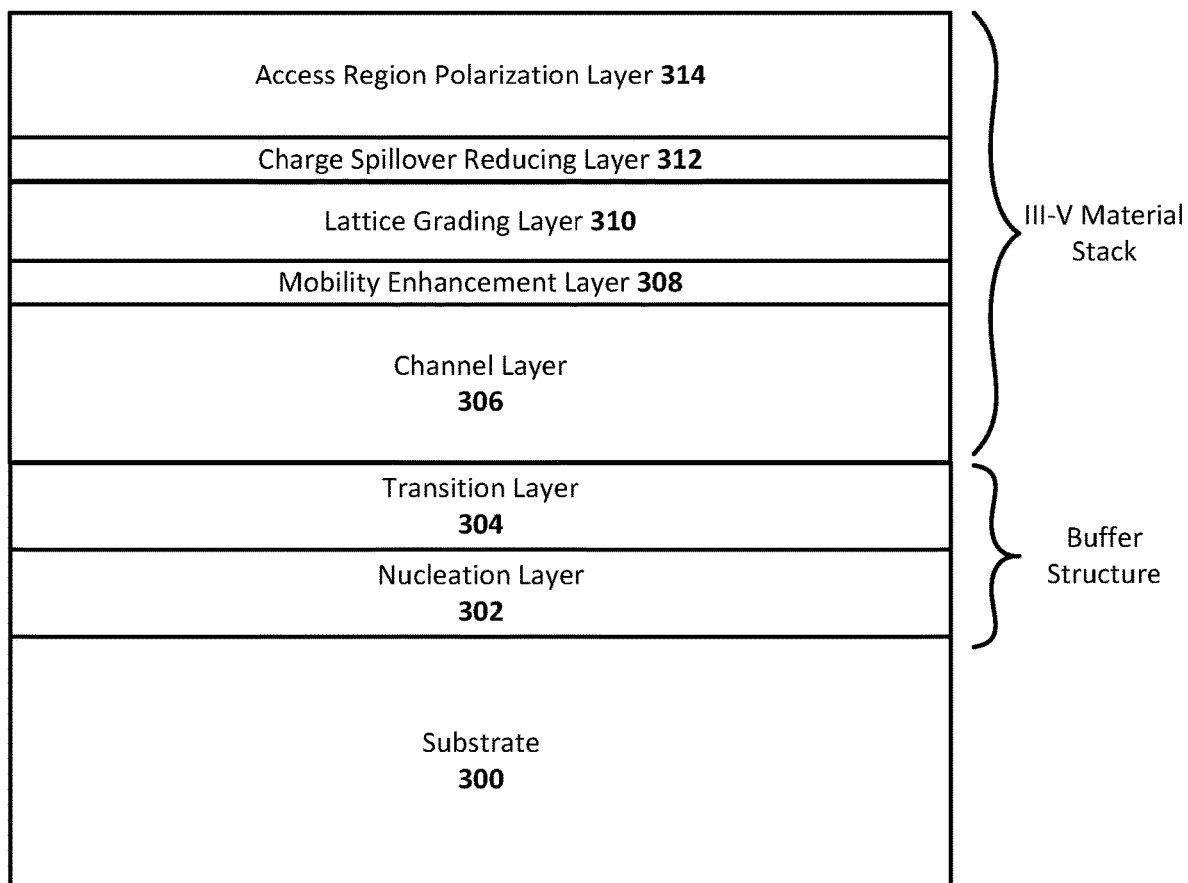
FIGS. 3a through 3f collectively illustrate an example process for preparing an integrated circuit structure having a gate stack configured in accordance with an embodiment of the present disclosure.

As can be seen in FIG. 3a, this process generally includes blanket deposition of various layers on a substrate, including layers that make up a III-V material stack and layers that make up a buffer structure to interface the substrate with the III-V material stack. As will be appreciated, each of layers 302 through 314 can be sequentially provided over substrate 300 in a blanket fashion using standard processing, such as chemical vapor deposition (CVD), atomic layer deposition (ALD), physical vapor deposition (PVD), and their various derivatives, to name a few examples.

The III-V material stack can be grown on any number of different substrates on which GaN and other III-V transistors can be made, such as silicon carbide (SiC), sapphire, and silicon substrates, whether in the form of bulk substrates (e.g., 300 mm silicon substrate) or multilayer substrates (e.g., semiconductor-on-insulator substrates). Numerous substrate configurations can be used.

The buffer structure generally employs standard defect and strain engineering techniques to better interface the III-V material stack with the substrate 300, such that the channel layer 306 can achieve a desired device quality. As such, the buffer structure may include any suitable III-V materials, and in some cases, III-N materials. In this example embodiment, the buffer structure includes an optional nucleation layer 302 and a transition layer 304. The nucleation layer 302 may be included, for instance, when the III-V stack is formed on or above a non-III-V material substrate (e.g., such as a silicon substrate). In embodiments where the nucleation layer is present, the nucleation layer 302 may be included to, for example, improve growth conditions and/or prevent the channel layer 306 from reacting with the substrate material in an undesired manner. In some such embodiments, the nucleation layer 302, where present, may include a III-V or III-N material, such as AlN or a low temperature GaN layer (e.g., epitaxially grown at a temperature in the range of 700 to 950 degrees Celsius), for example. In some embodiments, the nucleation layer, where present, may have any suitable thickness (dimension in the Y direction), such as a thickness of 10 nm to 2 microns (e.g., 200 nm to 1 micron), or any other suitable thickness as will be apparent in light of this disclosure. The transition layer 302 can also vary from embodiment to embodiment, depending on factors such as the underlying substrate 300, the channel layer 306, and whether a nucleation layer 302 is present. For instance, in the case where the substrate 300 is a silicon substrate or layer, the channel layer 306 is GaN, and the nucleation layer 302 is AlN, the transition layer can be AlGaN or InGaN. In some embodiments, the transition layer 304 may include alternating layers of III-V materials (e.g., AlGaN and InGaN) or a grade III-V layer that transition one or more components of the transition layer 304 from a first level compatible with the substrate 300 to a second level compatible with the channel layer 306. Any number of buffering techniques to interface one material system with another material system that is lattice-constant diverse can be used. In some embodiments, the overall buffer structure may have a thickness (dimension in the Y direction) in the range of 50 nm and 5 microns, or any other suitable thickness, as will be apparent in light of this disclosure.

Once the buffer structure is formed on the substrate 300, the methodology continues with: depositing the channel layer 306 (e.g., GaN layer having a thickness from 20 nm to 200 nm); depositing the mobility enhancement layer 308 (e.g., AlN layer of about 1 nm); depositing the lattice grading layer 310 (e.g., AlGaN of about 2 nm and an aluminum concentration of less than 15%); depositing the charge spillover reducing layer 312 (e.g., AlN layer of about 1 nm); and depositing the access region polarization layer 314 (e.g., AlInN layer of about 8 nm and an aluminum concentration in the range of 82%). Other embodiments and variants will be appreciated.

Figure 3B:
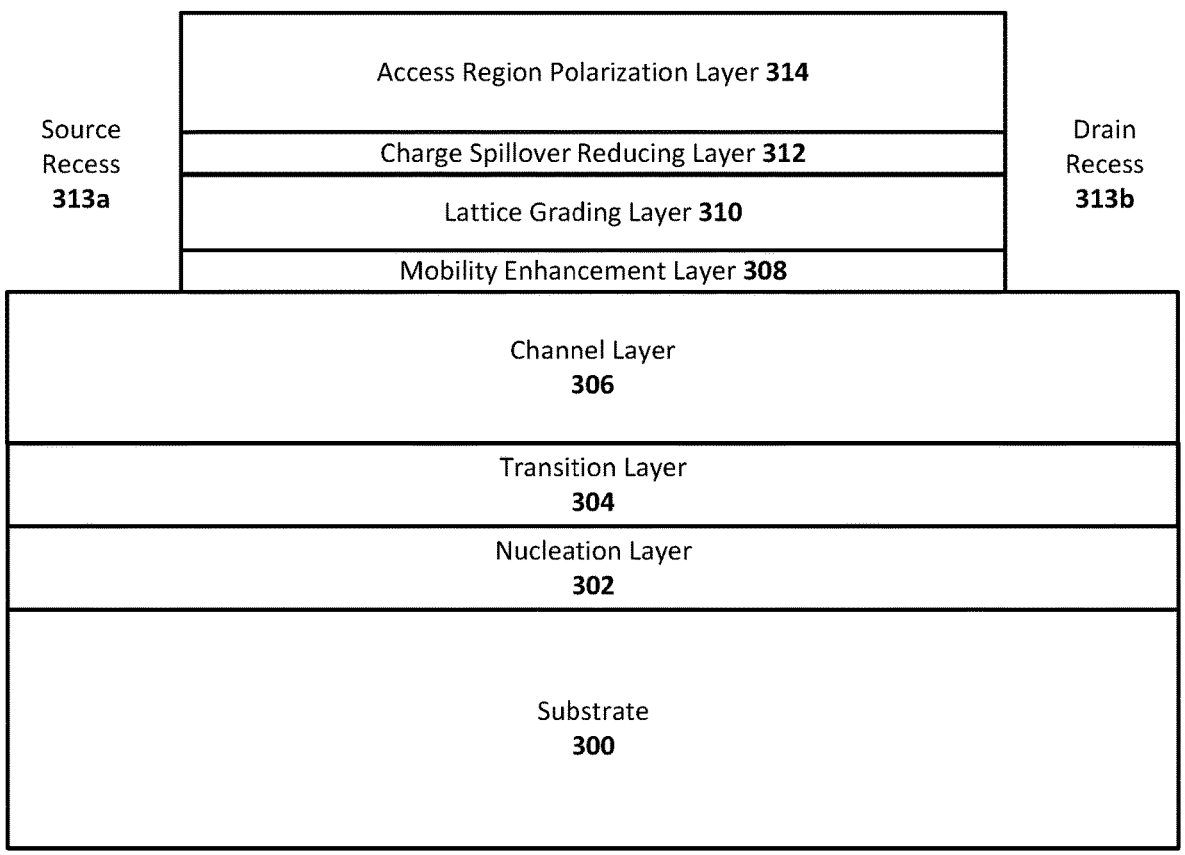
Figure 3C:
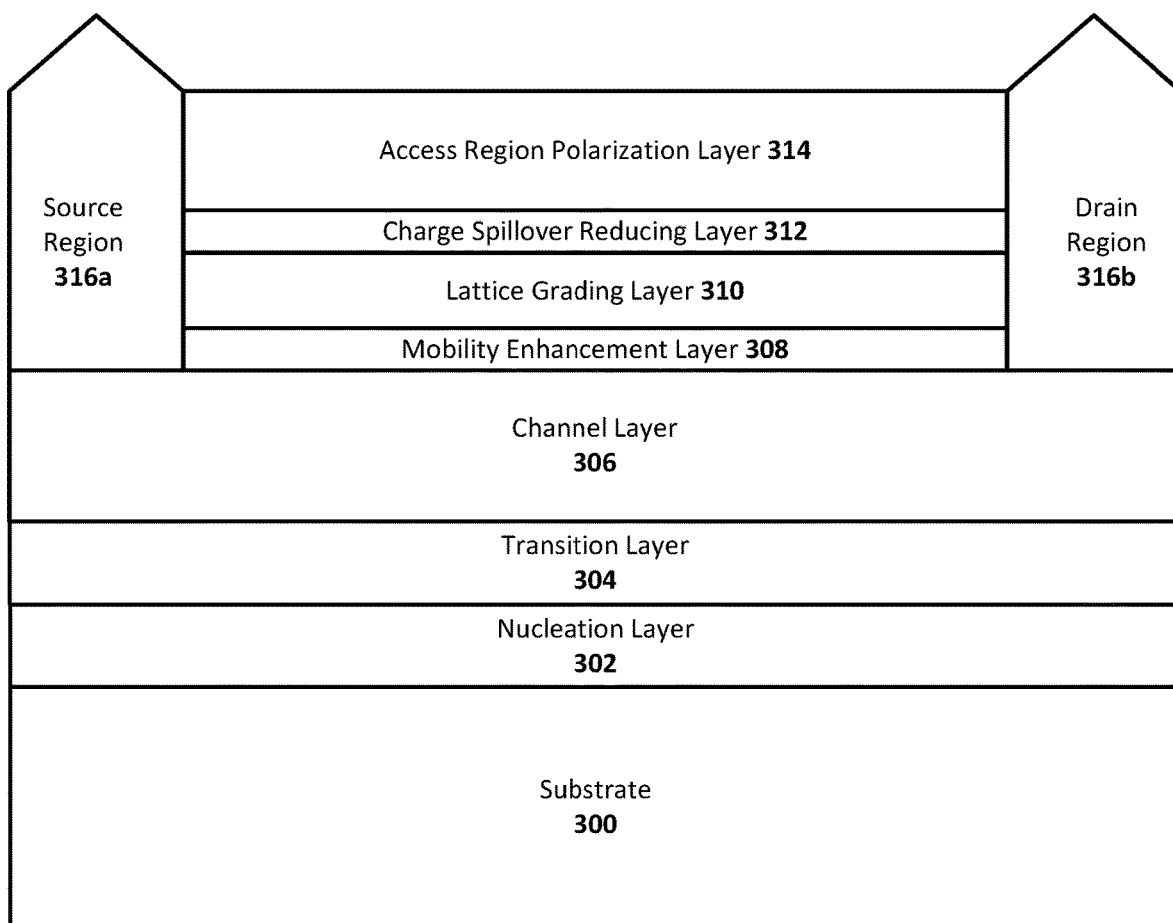

FIG. 3b show the resulting structure after the source recess 313a and drain recess 313b have been etched. Any suitable patterning and etch process can be used, including wet etches, dry etches, or a combination of both. Directional etching allows relatively straight sidewalls, to provide a mesa between regions 313a and 313b as shown. FIG. 3c shows the resulting structure after the source/drain regions 316a and 316b have been formed. As will be appreciated, the source/drain regions 316a and 316b may be formed by any combination of patterning/masking/lithography/etching with depositing, growing, and re-growing of the desired source/drain regions materials. In addition, the source/drain regions 316a and 316b may be doped in an n-type or p-type manner, using any suitable doping techniques. In an example embodiment, the methodology includes epitaxially growing source/drain regions 316a and 316b of GaN or InGaN that are doped in an n-type manner (e.g., doped with Si, Se, and/or Te, with doping amounts of around 2E20 per cubic cm). In some embodiments, one or both of the source/drain regions 316a and 316b have a multilayer structure including multiple materials. In some embodiments, one or both of the source/drain regions 316a and 316b may or may not include grading (e.g., increasing and/or decreasing) the content of one or more materials in at least a portion of one or both of the regions.

Figure 3D:
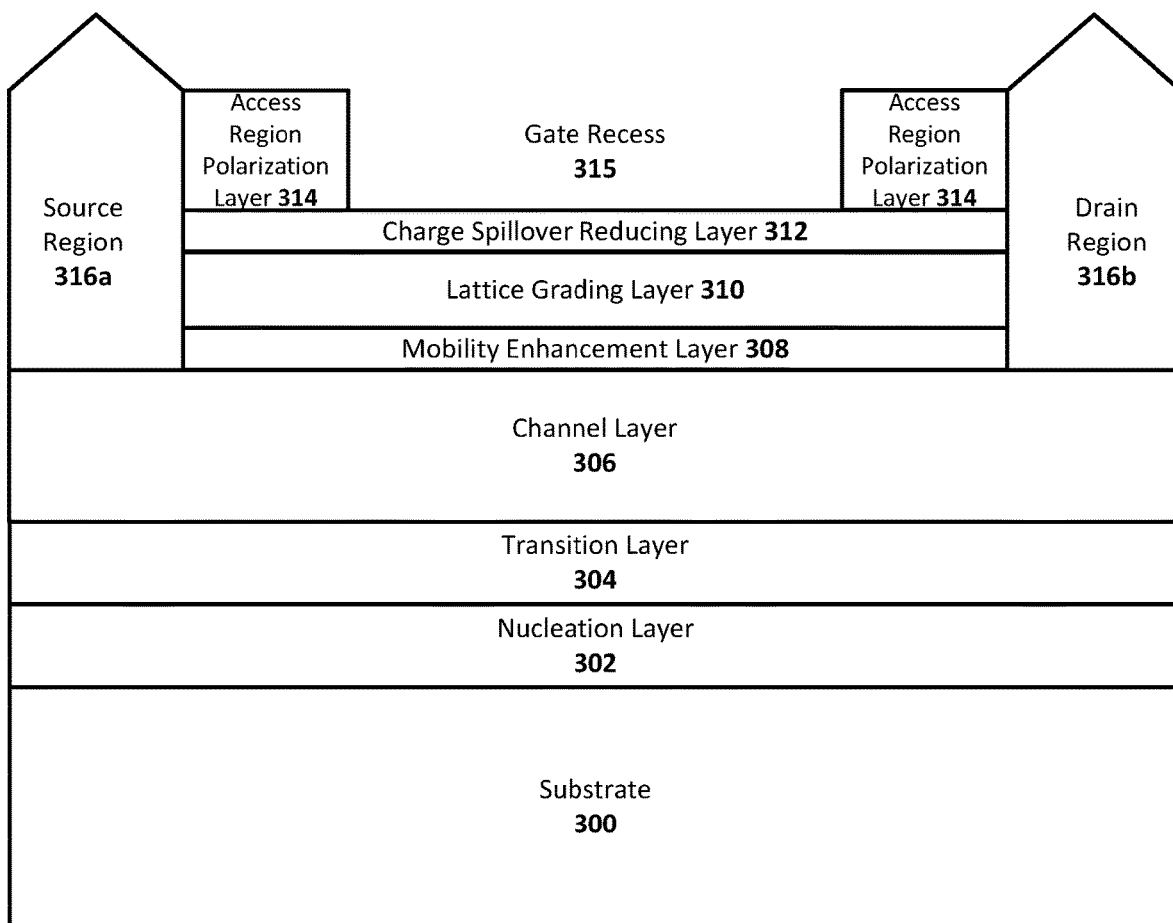

FIG. 3d shows the resulting structure after the gate recess 315 has been etched. Any suitable etchant can be used. For example, in one embodiment, the recess 315 is formed by a directional dry etch using sulfur hexafluoride ($SF_6$) etching or chlorine-based etching such as argon/chlorine ($Ar/Cl_2$) plasma etching. Numerous suitable etch schemes will be recognized given the various materials to be etched for a given configuration. Masking may be used to improve selectivity of the etch.

Figure 3E:
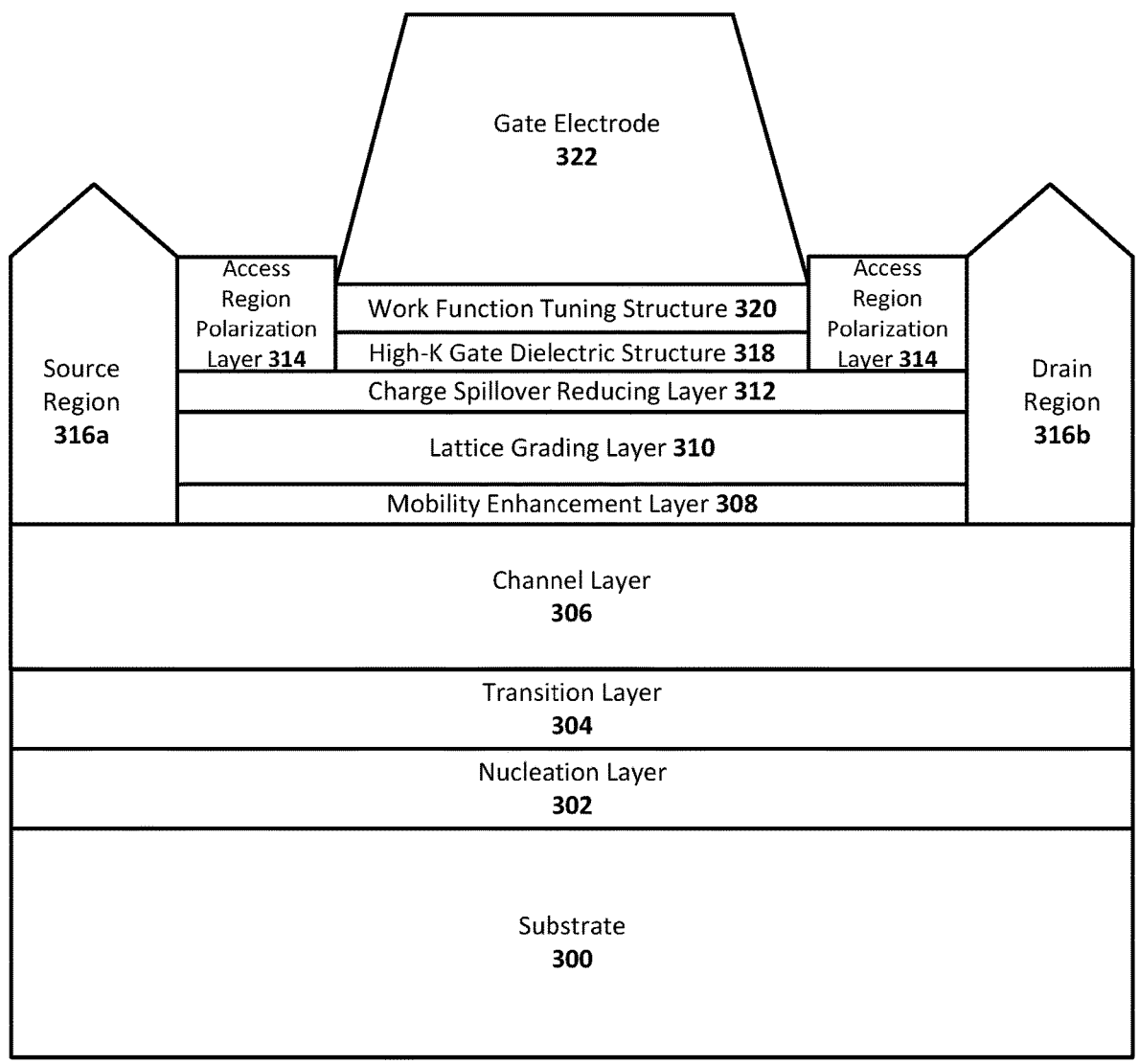
Figure 3E:
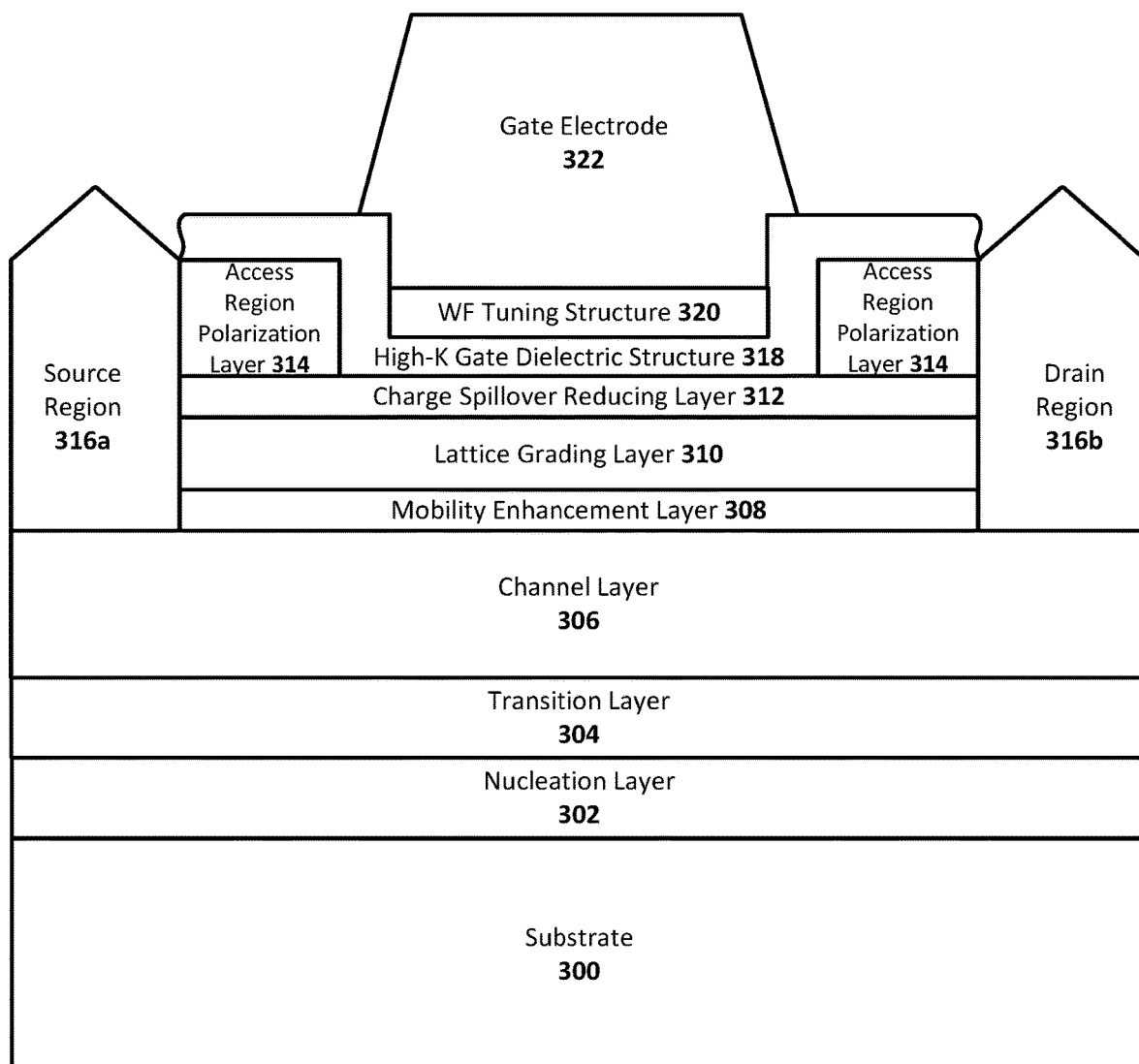

FIG. 3e shows the resulting structure after the high-k gate dielectric and metal gate formation, using standard deposition. As can be seen, a high-k gate dielectric structure 318 has been provided on the charge spillover reducing layer 312. The structure 318 may include, for example, an $Al_2O_3$ interface layer of about 1.5 nm and a $HfO_2$ high-k gate dielectric of about 4.5 nm, as previously described. A work function tuning structure 320 is also provided, which may include, for example, a bi-layer structure of TiN having a thickness of about 3 nm, and a layer thereon of nickel or platinum having a thickness of about 10 nm to 15 nm. The gate electrode 322 may be, for example, tungsten (W) and have a thickness of about 50 nm. FIG. 3e' shows an alternative embodiment where the high-k gate dielectric structure 318 extends out of the gate trench 315 and onto the access region polarization layer 314 as shown.

Figure 3F:
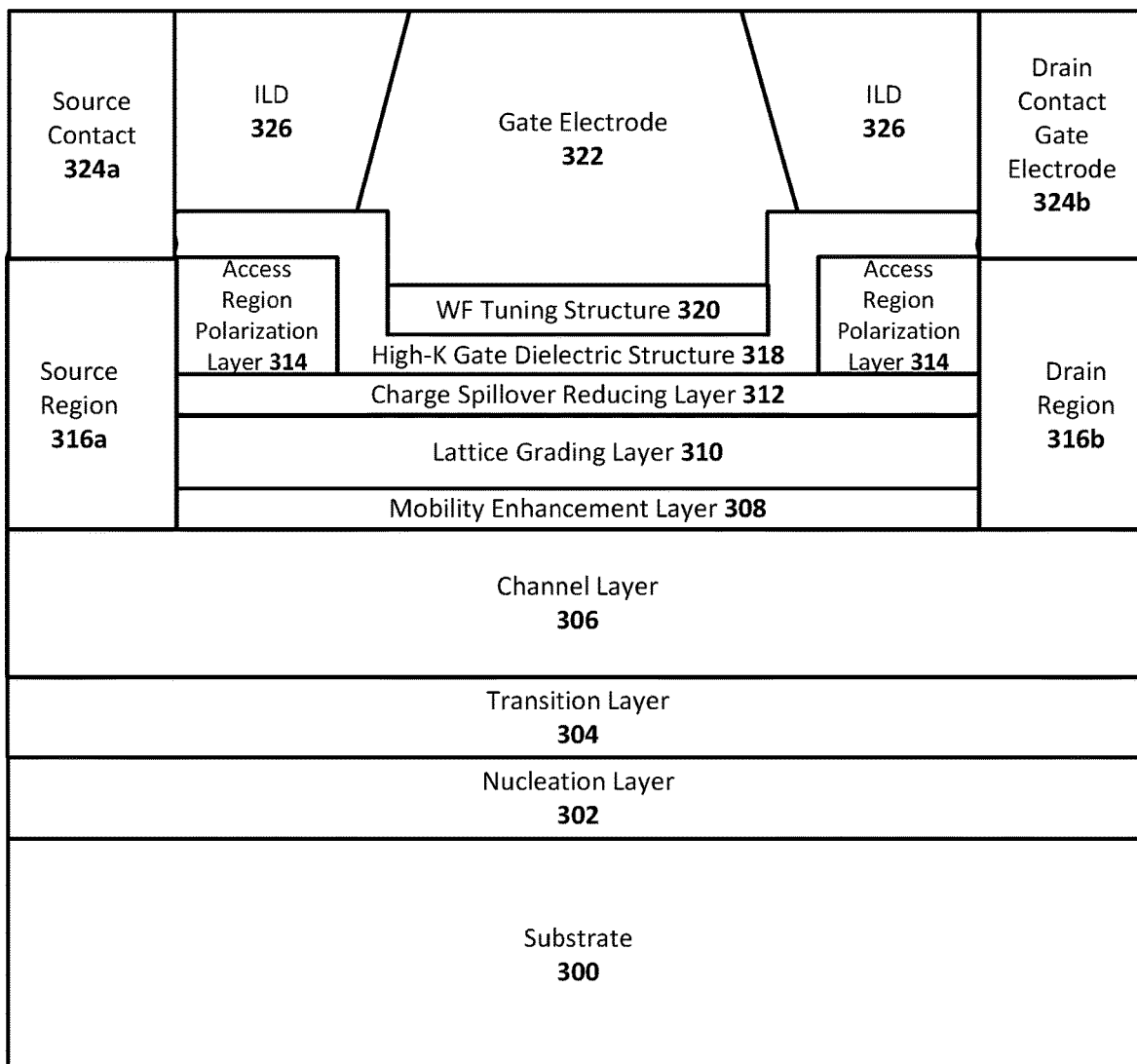

FIG. 3f shows the resulting structure after the source/drain contacts 324a-324b and the interlayer dielectric (ILD) layer 326 have been formed and planarized. As previously noted, some embodiments may not include source/drain contacts 324a-b. In some such case, the ILD 326 might extend over the source/drain regions 316a-b, and a conductor from an upper interconnect layer (not shown) can be coupled directly to the source/drain regions 316a-b through a trench in the ILD 326. Numerous such variations and other configurations will be apparent.

Lateral Epitaxial Overgrowth Forming Methodology

FIGS. 4a through 4e collectively illustrate an example process for preparing an integrated circuit structure having a gate stack configured in accordance with another embodiment of the present disclosure. This example embodiment uses epitaxial lateral overgrowth of III-V material to create the channel layer 406. Such a forming technique eliminates the need for a buffer structure.

Figure 4A:
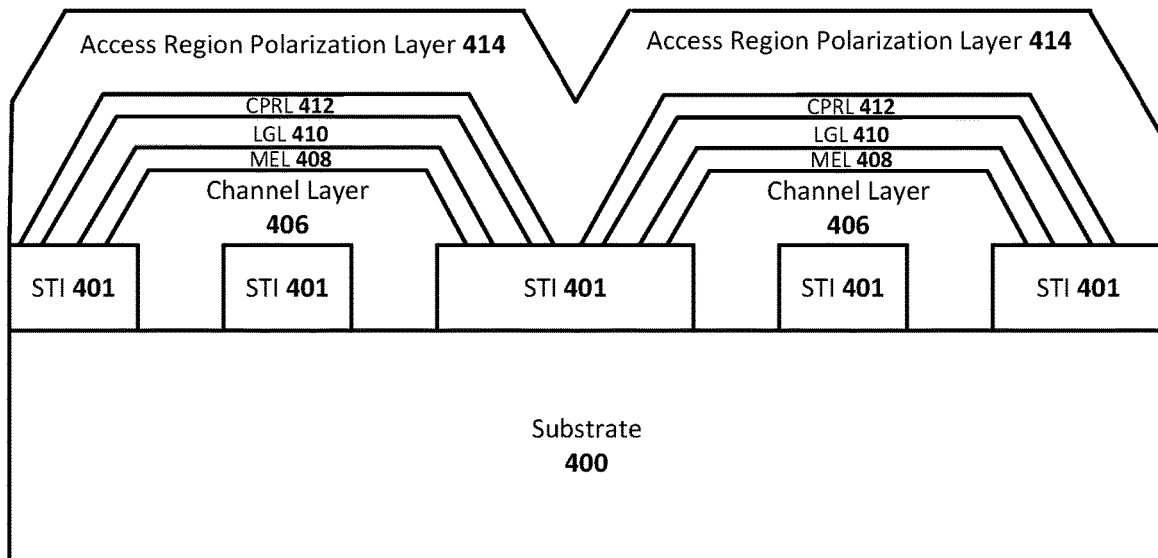
FIGS. 4a through 4e collectively illustrate an example process for preparing an integrated circuit structure having a gate stack configured in accordance with another embodiment of the present disclosure.
Figure 4A:
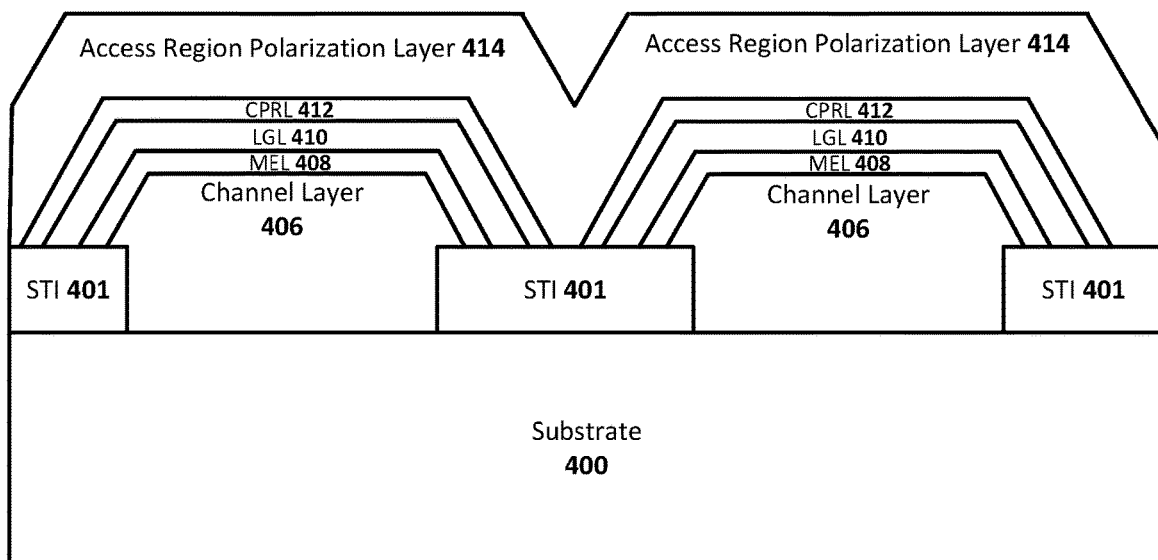

The methodology includes providing a substrate 400 having deposited thereon a relatively thick layer of shallow trench isolation (STI) material such as silicon dioxide or silicon nitride. The thickness of the STI layer 401 can be, for example, 30 nm to 500 nm. The STI layer 401 is then etched to provide a number of trenches from which III-V material can be grown. The spacing of the trenches can be set depending on the desired III-V growth pattern. In general, close trenches allow the III-V grown in neighboring trenches to merge when forming the channel layer 406 (as shown in FIG. 4a), wherein further spaced trenches prevent the III-V grown in neighboring trenches from merging when forming the channel layer 406 (as shown in FIG. 4a'). After forming of trenches in STI layer 401, the methodology continues with filling the trenches with III-V material from which the transistor channel layer 406 will be formed. Growth of channel layer 406 may be performed using any number of deposition techniques, including, for example, metal-organic chemical vapor deposition (MOCVD), molecular-beam epitaxy (MBE) chemical vapor deposition (CVD), atomic layer deposition (ALD), physical vapor deposition (PVD). According to an embodiment, the substrate 400 is a bulk silicon substrate or a silicon layer, the STI layer 401 is a 50 nm thick layer of silicon dioxide, and the channel layer 406 is GaN layer of about 100 nm (as measured from bottom of trench). The lateral overgrowth method allows defects that may be present within the grown GaN to bend as the GaN forms over the STI layer 401, leaving a faceted remainder of GaN outside the trench.

Conditions for overgrowth of the GaN or other III-V semiconductor material comprising channel layer 406 can be used to vary the properties of the resulting epitaxially grown structure. In some embodiments, faceting of the overgrowth region, or cap, of the channel layer is controlled by, for example, the V/III ratio for depositing the material and on the growth temperature and pressure. In general, increasing the V/III ratio favors rectangular facet formation, as does increasing deposition temperatures and decreasing pressures. Also in general, lower V/III ratios, lower temperatures, and higher pressures favor triangular facet formation. In addition, the direction of the trenches in the STI layer 401 with respect to the underlying crystal orientation of the substrate 400 can lead to different facets for the resulting overgrowth regions. In one specific embodiment, for example, for a <100> silicon substrate 400 and GaN layer 406, a trench orientation along the <110> direction favors triangular facets. In another example embodiment, for a <100> silicon substrate 400 and GaN layer 406, trench orientation along the <100> direction favors rectangular facets. In another example embodiment, for a <111> silicon substrate 400 and GaN layer 406, trench orientation along the <112> direction favors triangular facets.

In any case, once the overgrowth region of channel layer 406 is formed, the remainder of the layers can be deposited using standard deposition. In the embodiment shown, the methodology continues with: depositing the mobility enhancement layer (MEL) 408 (e.g., AlN layer of about 1 nm); depositing the lattice grading layer (LGL) 410 (e.g., AlGaN of about 2 nm and an aluminum concentration of less than 15%); depositing the charge spillover reducing layer (CPRL) 312 (e.g., AlN layer of about 1 nm); and depositing the access region polarization layer 414 (e.g., an AlInN layer of about 8 nm and an aluminum concentration of about 82%, or an AlGaN layer of about 8 nm and an aluminum concentration of about 30%). Other embodiments and variants will be appreciated.

Figure 4B:
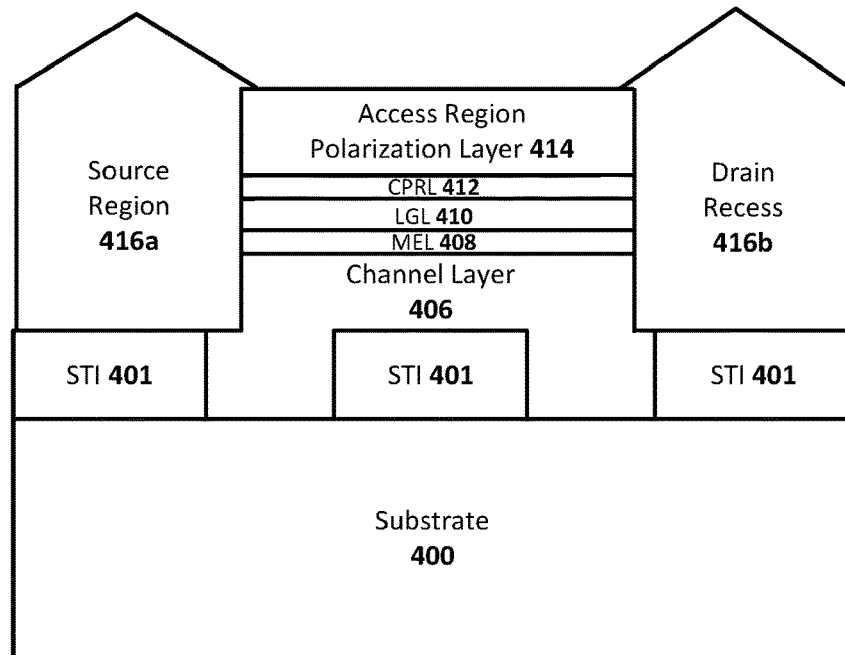
Figure 4C:
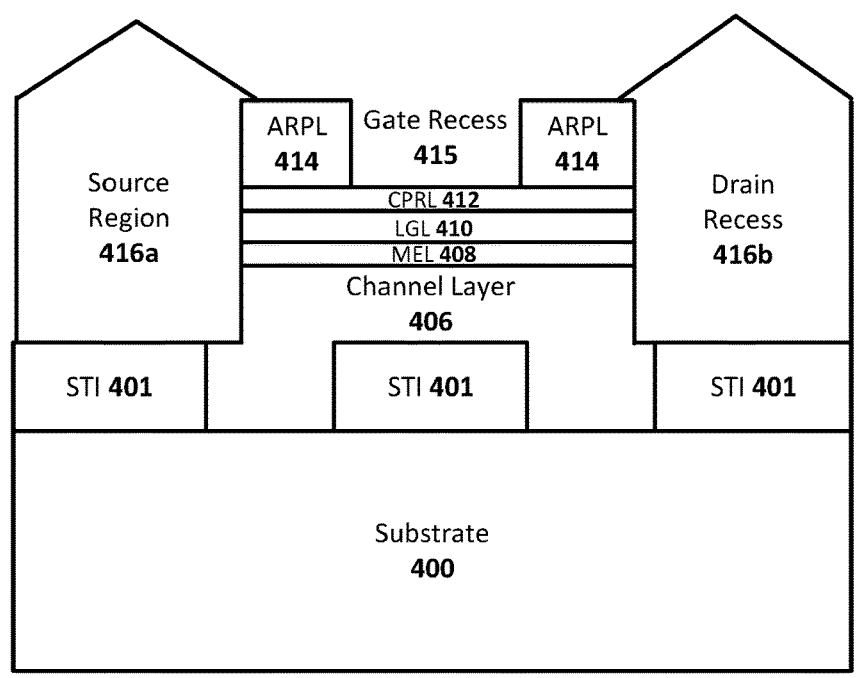

FIG. 4b show the resulting structure after the source/drain regions 416a and 416b have been formed, which may include a recessing and subsequent growth or other deposition of the desired source/drain materials, as discuss with reference to FIGS. 3b-c. The relevant discussion is equally applicable here. FIG. 4c shows the resulting structure after the gate recess 315 has been etched. Any suitable etchant can be used. For example, in one embodiment, the gate recess 415 is formed, which can be accomplished in a similar fashion as to gate recess 315.

Figure 4D:
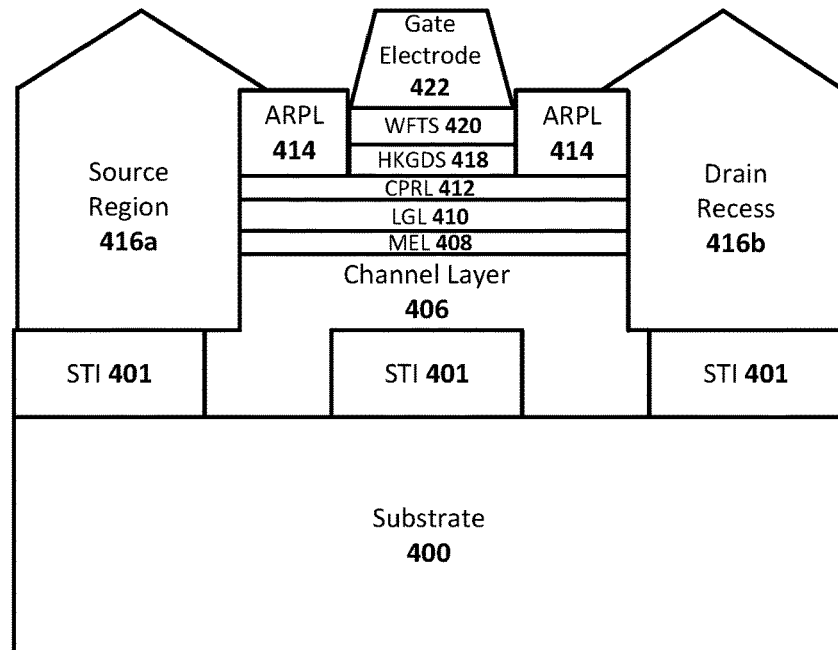
Figure 4D:
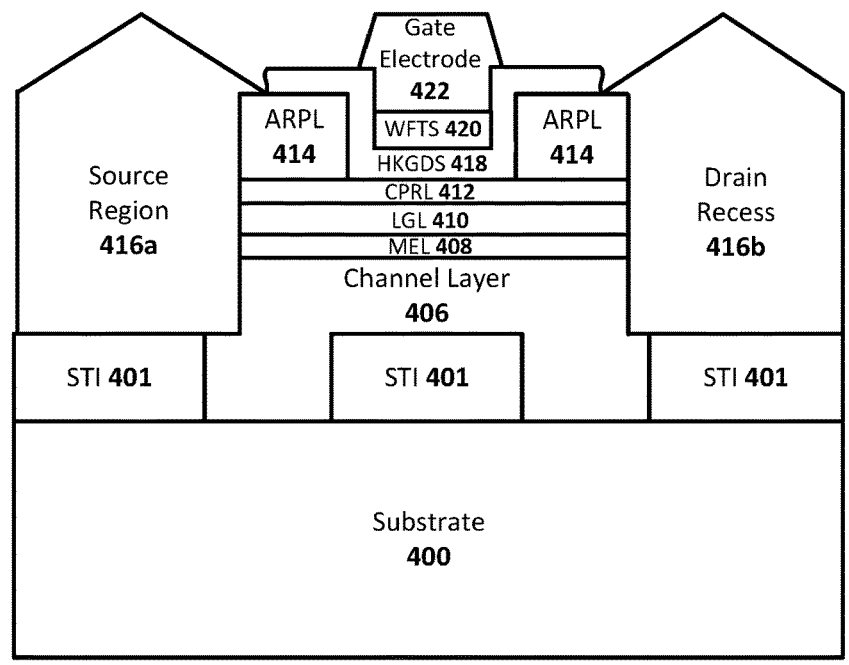

FIG. 4d shows the resulting structure after the high-k gate dielectric and metal gate formation, using standard deposition as previously described with reference to FIG. 3e-e'. As can be seen, a high-k gate dielectric structure (HKDS) 418 has been provided on the charge spillover reducing layer 412. The structure 418 may be configured in a similar fashion as to structure 318, as will be appreciated. A work function tuning structure (WFTS) 420 is also provided, which may be configured in a similar fashion as to structure 320, as will be appreciated. The gate electrode 422 may be, for example, tungsten (W) and have a thickness of about 50 nm. FIG. 4d' shows an alternative embodiment where the high-k gate dielectric structure 418 extends out of the gate trench 415 and onto the access region polarization layer 414 as shown.

Figure 4E:
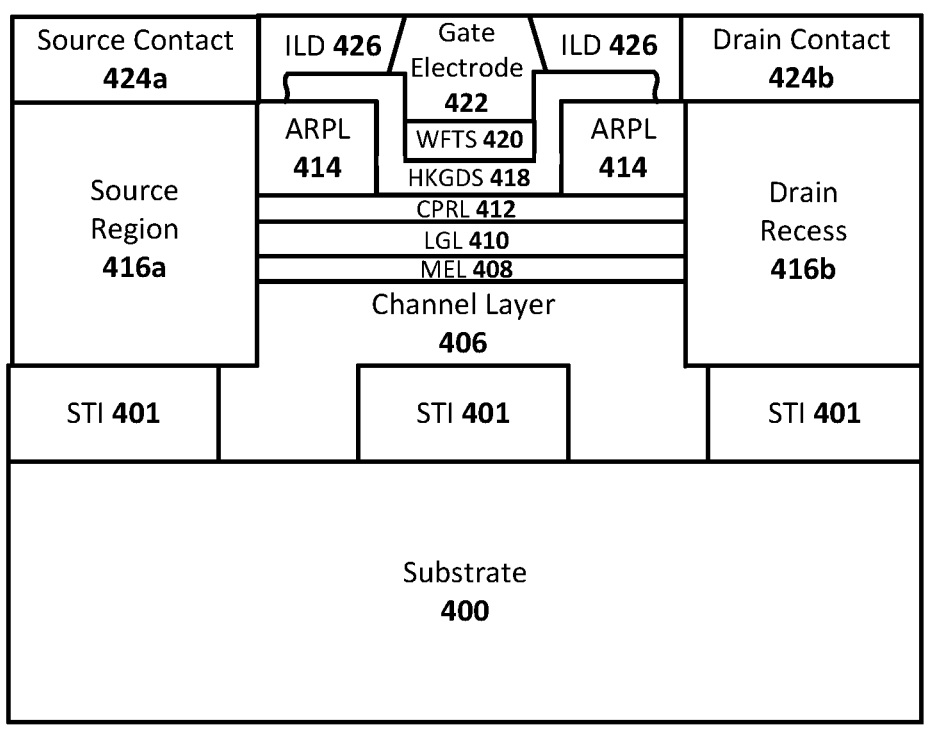

FIG. 4e shows the resulting structure after the source/drain contacts 424a-424b and the ILD layer 426 have been formed and planarized. As previously noted, some embodiments may not include source/drain contacts 424a-b. In some such case, the ILD 426 might extend over the source/drain regions 416a-b, and a conductor from an upper interconnect layer (not shown) can be coupled directly to the source/drain regions 416a-b through a trench in the ILD 326. Numerous such variations and other configurations will be apparent in light of this disclosure.

The structures and forming methods provided herein can be used to implement numerous high performance integrated circuits, such as system-on-chip (SOC) and chip set configurations directed to high frequency and/or high power applications, such as voltage regulators and radio frequency (RF) power amplifiers.

Example System

Figure 5:
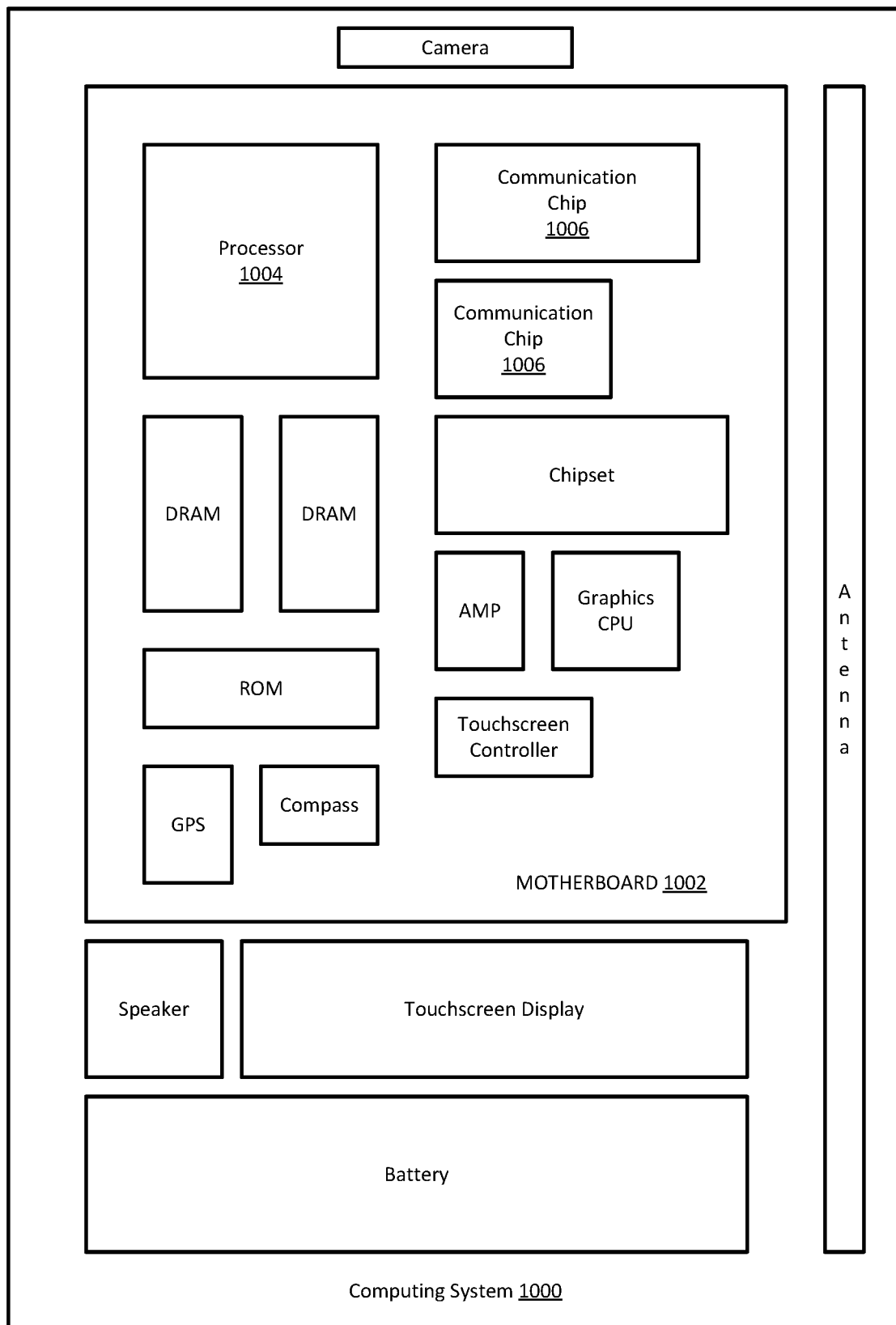
FIG. 5 is an example computing system implemented with one or more of the integrated circuit structures as disclosed herein, in accordance with some embodiments of the present disclosure.

FIG. 5 is an example computing system implemented with one or more of the integrated circuit structures as disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices configured in accordance with an example embodiment (e.g., III-V transistors configured with a lattice matched barrier structure between the channel layer and the gate dielectric structure in conjunction with access region polarization layers, according to some embodiments). In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others. In some embodiments, communication chip 1006 may include one or more transistor structures having a gate stack an access region polarization layer as variously described herein.

The processor 1004 of the computing system 1000 includes an integrated circuit die packaged within the processor 1004. In some embodiments, the integrated circuit die of the processor includes onboard circuitry that is implemented with one or more integrated circuit structures or devices as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit transistor structure, comprising: a channel layer including a group III-V semiconductor; a gate stack over the channel layer, and including a layer of aluminum gallium nitride (AlGaN) between first and second layers of aluminum nitride (AlN); source and drain regions each including a group III-V semiconductor and separated from the gate stack by respective access regions; and polarization material in the access regions, the polarization material including a group III-V semiconductor.

Example 2 includes the subject matter of Example 1, wherein the channel layer is gallium nitride (GaN).

Example 3 includes the subject matter of Example 1 or 2, and further includes a substrate underlying the channel layer.

Example 4 includes the subject matter of Example 3, wherein the substrate is a bulk silicon substrate. Other substrate materials and configurations can be used as well, such as multilayer substrates and semiconductor-on-insulator substrates. III-V substrates can be used as well.

Example 5 includes the subject matter of any of the previous Examples, wherein the gate stack further includes a gate dielectric structure.

Example 6 includes the subject matter of Example 5, wherein the gate dielectric structure is a multi-layer structure including a layer of interface material and a layer of high-k dielectric material.

Example 7 includes the subject matter of Example 6, wherein the layer of interface material is or otherwise includes a group III-V semiconductor oxide.

Example 8 includes the subject matter of Example 6, wherein the layer of interface material comprises aluminum oxide ($Al_2O_3$), and the high-k dielectric comprises hafnium oxide.

Example 9 includes the subject matter of any of the previous Examples, wherein the gate stack further includes a work function tuning structure.

Example 10 includes the subject matter of Example 9, wherein the work function tuning structure is a multi-layer structure.

Example 11 includes the subject matter of any of the previous Examples, wherein the gate stack further includes a gate electrode. Note the gate electrode may also be a multilayer structure, such as one or more contact-resistance reducing layers and one or more layers of elemental metal. Further note that in some cases, the gate electrode is a multilayer structure that includes one or more work function tuning layers.

Example 12 includes the subject matter of any of the previous Examples, wherein the layer of AlGaN between the first and second layers of AlN has an aluminum concentration in the range of 5% to 15%.

Example 13 includes the subject matter of any of the previous Examples, wherein the layer of AlGaN between the first and second layers of AlN has a thickness in the range of about 1 nm to 3 nm, and the first and second layers of AlN each has a thickness in the range of 0.5 nm to 2 nm.

Example 14 includes the subject matter of any of the previous Examples, wherein the source and drain regions include gallium nitride (GaN) or indium gallium nitride (InGaN).

Example 15 includes the subject matter of any of the previous Examples, wherein the source and drain regions are n-doped.

Example 16 includes the subject matter of any of the previous Examples, wherein the transistor structure comprises an enhancement-mode metal oxide semiconductor high-electron-mobility transistor (MOSHEMT).

Example 17 includes the subject matter of Example 16, wherein the enhancement-mode MOSHEMT is an NMOS transistor.

Example 18 includes the subject matter of any of the previous Examples, wherein the polarization material in the access regions includes aluminum and nitrogen.

Example 19 includes the subject matter of any of the previous Examples, wherein the polarization material in the access regions includes aluminum indium nitride (AlInN), and has an aluminum concentration in the range of 80% to 85%.

Example 20 includes the subject matter of any of Examples 1 through 18, wherein the polarization material in the access regions includes aluminum gallium nitride (AlGaN), and has an aluminum concentration in the range of 20% to 40%.

Example 21 includes the subject matter of any of the previous Examples, wherein the polarization material in the access regions has an aluminum concentration that is greater than the aluminum concentration of the AlGaN layer between the first and second layers of AlN.

Example 22 includes the subject matter of any of the previous Examples, wherein the polarization material in the access regions has a vertical thickness in the range of 5 nm to 25 nm. Vertical thickness is not intended to limit the structure to a specific orientation but merely to express the thickness of the polarization layer in a direction that is effectively perpendicular to the AlGaN layer (or to another underlying or overlying layer).

Example 23 is a system-on-chip (SOC) comprising the integrated circuit transistor structure of any of the preceding Examples.

Example 24 is a radio frequency (RF) circuit comprising the integrated circuit transistor structure of any of the preceding Examples.

Example 25 is a mobile computing system comprising the integrated circuit transistor structure of any of the preceding Examples. Example mobile computing systems include, for instance, a smart phone, a tablet, and a laptop, to name a few examples. Other systems can equally employ such an integrated circuit structure as will be appreciated (e.g., a game controller, set-top box, desktop computer, measurement equipment, radio equipment, receiver circuitry, transmit circuitry, etc).

Example 26 includes an integrated circuit transistor structure, comprising: a channel layer including gallium nitride (GaN); a gate stack over the channel layer, and including a barrier structure configured with a charge spillover reducing layer on a lattice grading layer, each of the charge spillover reducing layer and lattice grading layer including a different group III-N semiconductor; source and drain regions each including a group III-V semiconductor and separated from the gate stack by respective access regions; and polarization material in the access regions, the polarization material including a group III-V semiconductor.

Example 27 includes the subject matter of Example 26, and further includes a bulk silicon substrate underlying the channel layer.

Example 28 includes the subject matter of Example 26 or 27, wherein the gate stack further includes a gate dielectric structure.

Example 29 includes the subject matter of Example 28, wherein the gate dielectric structure is a multi-layer structure including a layer of interface material and a layer of high-k dielectric material.

Example 30 includes the subject matter of any of Examples 26 through 29, wherein the gate stack further includes a work function tuning structure.

Example 31 includes the subject matter of Example 30, wherein the work function tuning structure is a multi-layer structure.

Example 32 includes the subject matter of any of Examples 26 through 31, wherein the gate stack further includes a gate electrode. Recall the gate electrode may be a multilayer structure, and may include work function tuning.

Example 33 includes the subject matter of any of Examples 26 through 32, wherein the lattice grading layer comprises aluminum gallium nitride (AlGaN) and the charge spillover reducing layer comprises aluminum nitride (AlN).

Example 34 includes the subject matter of Example 33, wherein the lattice grading layer has a thickness in the range of about 1 nm to 3 nm and an aluminum concentration in the range of 5% to 15%, and the charge spillover reducing layer has a thickness in the range of 0.5 nm to 2 nm.

Example 35 includes the subject matter of any of Examples 26 through 34, wherein the source and drain regions are n-doped and include gallium nitride (GaN) or indium gallium nitride (InGaN).

Example 36 includes the subject matter of any of Examples 26 through 35, wherein the polarization material in the access regions includes aluminum and nitrogen.

Example 37 includes the subject matter of any of Examples 26 through 36, wherein the polarization material in the access regions includes aluminum indium nitride (AlInN), and has an aluminum concentration in the range of 80% to 85%.

Example 38 includes the subject matter of any of Examples 26 through 36, wherein the polarization material in the access regions includes aluminum gallium nitride (AlGaN), and has an aluminum concentration in the range of 20% to 40%.

Example 39 includes the subject matter of any of Examples 26 through 38, wherein the lattice grading layer includes aluminum, and the polarization material in the access regions has an aluminum concentration that is greater than the aluminum concentration of the lattice grading layer.

Example 40 is a system-on-chip comprising the integrated circuit transistor structure of any of Examples 26 through 39.

Example 41 is a radio frequency (RF) circuit comprising the integrated circuit transistor structure of any of Examples 26 through 40.

Example 42 is a mobile computing system comprising the integrated circuit transistor structure of any of Examples 26 through 41.

Example 43 is a method for forming an integrated circuit transistor structure, the method comprising: forming a channel layer on a substrate, the channel layer comprising gallium nitride (GaN), or some other III-V or III-N compound; forming a gate stack over the channel layer, the gate stack including a layer of aluminum gallium nitride (AlGaN) between first and second layers of aluminum nitride (AlN); forming source and drain regions each including a group III-V semiconductor and separated from the gate stack by respective access regions; and forming polarization material in the access regions, the polarization material including a group III-V semiconductor.

Example 44 includes the subject matter of Example 43, wherein the substrate is a bulk silicon substrate.

Example 45 includes the subject matter of Example 43 or 44, wherein the gate stack further includes at least one of a gate dielectric structure and a work function tuning structure.

Example 46 includes the subject matter of Example 45, wherein at least one of the gate dielectric structure and the work function tuning structure is a multi-layer structure.

Example 47 includes the subject matter of any of Examples 43 through 46, wherein the gate stack further includes a gate electrode.

Example 48 includes the subject matter of any of Examples 43 through 47, wherein the layer of AlGaN between the first and second layers of AlN has an aluminum concentration in the range of 5% to 15%.

Example 49 includes the subject matter of any of Examples 43 through 48, wherein the layer of AlGaN between the first and second layers of AlN has a thickness in the range of about 1 nm to 3 nm, and the first and second layers of AlN each has a thickness in the range of 0.5 nm to 2 nm.

Example 50 includes the subject matter of any of Examples 43 through 49, wherein the source and drain regions are n-doped and include gallium nitride (GaN) or indium gallium nitride (InGaN).

Example 51 includes the subject matter of any of Examples 43 through 50, wherein the group III-V semiconductor polarization material in the access regions includes aluminum and nitrogen.

Example 52 includes the subject matter of any of Examples 43 through 51, wherein the polarization material in the access regions includes aluminum indium nitride (AlInN), and has an aluminum concentration in the range of 80% to 85%.

Example 53 includes the subject matter of any of Examples 43 through 51, wherein the polarization material in the access regions includes aluminum gallium nitride (AlGaN), and has an aluminum concentration in the range of 20% to 40%.

Example 54 includes the subject matter of any of Examples 43 through 53, wherein the polarization material in the access regions has an aluminum concentration that is greater than the aluminum concentration of the AlGaN layer between the first and second layers of AlN.

Example 55 includes the subject matter of any of Examples 43 through 54, wherein the polarization material in the access regions has a vertical thickness in the range of 5 nm to 25 nm.

Example 56 is a system-on-chip formed by the method of any of Examples 43 through 55.

Example 57 is a radio frequency (RF) circuit formed by the method of any of Examples 43 through 56.

Example 58 is a mobile computing system formed by the method of any of Examples 43 through 57.

The foregoing description of example embodiments has been presented for the purposes of illustration and description. It is not intended to be exhaustive or to limit this disclosure to the precise forms disclosed. Many modifications and variations are possible in light of this disclosure. It is intended that the scope of this disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit structure, comprising:
   a first layer including a group III-V semiconductor material;
   a gate stack over the first layer, and including a second layer of aluminum gallium nitride (AlGaN) between third and fourth layers of aluminum nitride (AlN); and
   a first region and a second region each including a group III-V semiconductor and separated from the gate stack by respective third regions,
   the third regions including a group III-V semiconductor material.

2. The integrated circuit structure of claim 1, wherein the first layer is gallium nitride (GaN).

3. The integrated circuit structure of claim 1, wherein the gate stack further includes:
   a gate electrode; and
   a gate dielectric structure, wherein the gate dielectric structure is a multi-layer structure including a layer of interface material and a layer of high-k dielectric material, wherein the layer of interface material is a group III-V semiconductor oxide.

4. The integrated circuit structure of claim 1, wherein the second layer of AlGaN between the third and fourth layers of AlN has an aluminum concentration in the range of 5% to 15%.

5. The integrated circuit structure of claim 1, wherein the second layer of AlGaN between the third and fourth layers of AlN has a thickness in the range of 1 nm to 3 nm, and the third and fourth layers of AlN each has a thickness in the range of 0.5 nm to 2 nm.

6. The integrated circuit structure of claim 1, wherein the first and second regions are n-doped and include nitrogen and one or both of gallium and indium.

7. The integrated circuit structure of claim 1, wherein the group III-V semiconductor material of the third regions includes aluminum and nitrogen.

8. The integrated circuit structure of claim 7, wherein the group III-V semiconductor material of the third regions further includes indium, and has an aluminum concentration in the range of 80% to 85%.

9. The integrated circuit structure of claim 7, wherein the group III-V semiconductor material of the third regions further includes gallium, and has an aluminum concentration in the range of 20% to 40%.

10. The integrated circuit structure of claim 1, wherein the group III-V semiconductor material of the third regions has an aluminum concentration that is greater than the aluminum concentration of the second AlGaN layer between the third and fourth layers of AlN.

11. A system-on-chip comprising the integrated circuit structure of claim 1.

12. A radio frequency (RF) circuit comprising the integrated circuit structure of claim 1.

13. A mobile computing system comprising the integrated circuit structure of claim 1.

14. The integrated circuit structure of claim 1, wherein the gate stack includes a layer of high-k dielectric material directly on the third layer of AlN.

15. An integrated circuit structure, comprising:
 a first layer including gallium nitride (GaN);
 a gate stack over the first layer, and including a barrier structure configured with a charge spillover reducing layer on a lattice grading layer, each of the charge spillover reducing layer and lattice grading layer including a different group III-N semiconductor, wherein the lattice grading layer includes aluminum; and
 a first region and a second region each including a group III-V semiconductor and separated from the gate stack by respective third regions, wherein the first and second regions are n-doped and include gallium nitride (GaN) or indium gallium nitride (InGaN), and wherein the third regions include a group III-V semiconductor material having an aluminum concentration that is greater than the aluminum concentration of the lattice grading layer.

16. The integrated circuit structure of claim 15, wherein the gate stack further includes a gate electrode and a work function tuning structure, wherein the work function tuning structure is a multi-layer structure.

17. The integrated circuit structure of claim 15, wherein the lattice grading layer comprises aluminum gallium nitride (AlGaN) and the charge spillover reducing layer comprises aluminum nitride (AlN), and wherein the lattice grading layer has a thickness in the range of 1 nm to 3 nm and an aluminum concentration in the range of 5% to 15%, and the charge spillover reducing layer has a thickness in the range of 0.5 nm to 2 nm.

18. The integrated circuit structure of claim 15, wherein the group III-V semiconductor material of the third regions includes aluminum indium nitride (AlInN), and has an aluminum concentration in the range of 80% to 85%.

19. The integrated circuit structure of claim 15, wherein the group III-V semiconductor material of the third regions includes aluminum gallium nitride (AlGaN), and has an aluminum concentration in the range of 20% to 40%.

20. The integrated circuit structure of claim 15, wherein the gate stack includes a layer of high-k dielectric material directly on the charge spillover reducing layer.

* * * * *